(12) United States Patent
Liang

(10) Patent No.: US 12,205,890 B2
(45) Date of Patent: Jan. 21, 2025

(54) CIRCUIT STRUCTURE, SEMICONDUCTOR DEVICE AND METHOD OF MANUFACTURING THE SAME

(71) Applicant: MACRONIX International Co., Ltd., Hsinchu (TW)

(72) Inventor: Li-Yen Liang, Kaohsiung (TW)

(73) Assignee: MACRONIX International Co., Ltd., Hsinchu (TW)

( * ) Notice: Subject to any disclaimer, the term of this patent is extended or adjusted under 35 U.S.C. 154(b) by 412 days.

(21) Appl. No.: 17/737,762

(22) Filed: May 5, 2022

(65) Prior Publication Data

US 2023/0361026 A1  Nov. 9, 2023

(51) Int. Cl.
| | |
|---|---|
| H01L 23/522 | (2006.01) |
| H01L 23/528 | (2006.01) |
| H10B 43/10 | (2023.01) |
| H10B 43/27 | (2023.01) |
| H10B 43/40 | (2023.01) |

(52) U.S. Cl.
CPC ...... *H01L 23/5228* (2013.01); *H01L 23/5226* (2013.01); *H01L 23/5283* (2013.01); *H10B 43/10* (2023.02); *H10B 43/27* (2023.02); *H10B 43/40* (2023.02)

(58) Field of Classification Search
CPC ........ H10B 43/10; H10B 43/27; H10B 43/40; H10B 43/20; H01L 23/5228; H01L 23/522; H01L 23/5226; H01L 23/5283; H01L 23/528; H01L 27/0629; H01L 27/06; H01L 27/14634; H01L 27/0924; H01L 27/1266; H01L 28/20; H01L 28/24; H01L 28/91; H01L 28/40
See application file for complete search history.

(56) References Cited

U.S. PATENT DOCUMENTS

| | | | |
|---|---|---|---|
| 11,456,316 B2 * | 9/2022 | Noh | H10B 41/49 |
| 2018/0247953 A1 | 8/2018 | Lee | |
| 2019/0019804 A1 | 1/2019 | Jeong et al. | |
| 2021/0193678 A1 * | 6/2021 | Noh | H10B 41/10 |

FOREIGN PATENT DOCUMENTS

| | | |
|---|---|---|
| TW | 202147581 | 12/2021 |
| TW | I759015 | 3/2022 |

OTHER PUBLICATIONS

"Notice of allowance of Taiwan Counterpart Application", issued on Jan. 31, 2023, p. 1-p. 4.

\* cited by examiner

*Primary Examiner* — Nikolay K Yushin
(74) *Attorney, Agent, or Firm* — J.C. PATENTS

(57) ABSTRACT

A semiconductor device may be applied in a three-dimensional AND flash memory device. The semiconductor device includes a dielectric substrate, a composite stack structure, a vertical pillar array and a resistor. The dielectric substrate includes a first region and a second region. The composite stack structure is located over the dielectric substrate in the first region and the second region. The vertical pillar array is disposed in the composite stack structure in the first region. The resistor is laterally adjacent to the vertical pillar array, extends below the composite stack structure in the second region, extends through the composite stack structure, and extends above the composite stack structure.

20 Claims, 22 Drawing Sheets ical Field

The embodiment of the disclosure relates to an integrated circuit structure and a method of manufacturing the same, and particularly to a semiconductor device and a method of manufacturing the same.

Description of Related Art

Since a non-volatile memory has the advantage that stored data does not disappear at power-off, it becomes a widely used memory for a personal computer or other electronics equipment. Currently, the 3D memory commonly used in the industry includes a NOR memory and a NAND memory. In addition, another 3D memory is an AND memory, which may be applied to a multi-dimensional memory array with high integration and high area utilization, and has an advantage of a fast operation speed. Therefore, the development of a 3D AND flash memory device has gradually become the current trend.

SUMMARY

The embodiment of disclosure provides a semiconductor device which may form a resistor around vertical pillar array.

An embodiment of the present invention provides a method for manufacturing a semiconductor device which may be integrated with an existing process to form a resistor around a vertical pillar array.

A semiconductor device according to an embodiment of the disclosure includes a dielectric substrate, a composite stack structure, a vertical pillar array and a resistor. The dielectric substrate includes a first region and a second region. The composite stack structure is located over the dielectric substrate in the first region and the second region. The vertical pillar array is disposed in the composite stack structure in the first region. The resistor is laterally adjacent to the vertical pillar array, extends below the composite stack structure in the second region, extends through the composite stack structure, and extends above the composite stack structure.

A integrated circuit structure according to an embodiment of the disclosure includes a composite stack structure, a plurality of dummy channel pillars, a plurality of conductive pillars, a stop layer and an interconnect structure. The composite stack structure is located on a dielectric substrate. The composite stack structure includes an intermediate stack structure, and the intermediate stack structure includes a plurality of interlayers and a plurality of insulating layers stacked alternately with each other. The dummy channel pillars extend through the intermediate stack structure. The conductive pillars extend through the plurality of dummy channel pillars and are electrically connected to the plurality of dummy channel pillars. The stop layer is located between the dielectric substrate and the composite stack structure. The stop layer includes a plurality of first conductive features. The interconnect structure is located above the composite stack structure. The interconnect structure includes a plurality of second conductive features. Portions of the plurality of conductive pillars, portions of the plurality of first conductive features and portions of the plurality of second conductive features are connected with each other to form a resistor.

A method of manufacturing a semiconductor device according to an embodiment of the disclosure includes the following steps. A dielectric substrate is provided, wherein the dielectric substrate includes a first region and a second region. A composite stack structure is formed over the first region and the second region of the dielectric substrate. A vertical pillar array and a resistor are formed. The vertical pillar array is disposed in the composite stack structure in the first region. The resistor extends below the composite stack structure in the second region, passes through the composite stack structure, and extends above the composite stack structure.

The semiconductor device of the present disclosure embodiment may form a resistor around the vertical pillar array.

The method of manufacturing the semiconductor device of the present disclosure embodiment may be integrated with the existing process to form a resistor in the vertical pillar array.

DESCRIPTION OF THE EMBODIMENTS

In the present embodiment, a resistor is provided in an integrated circuit having a vertical pillar array. The vertical pillar array may be a memory array. The resistors are disposed in the peripheral region around the vertical column array. For brevity, a memory array of 3D AND flash memory as a vertical pillar array is described below, however, the present invention is not limited thereto.

Figure 1A:
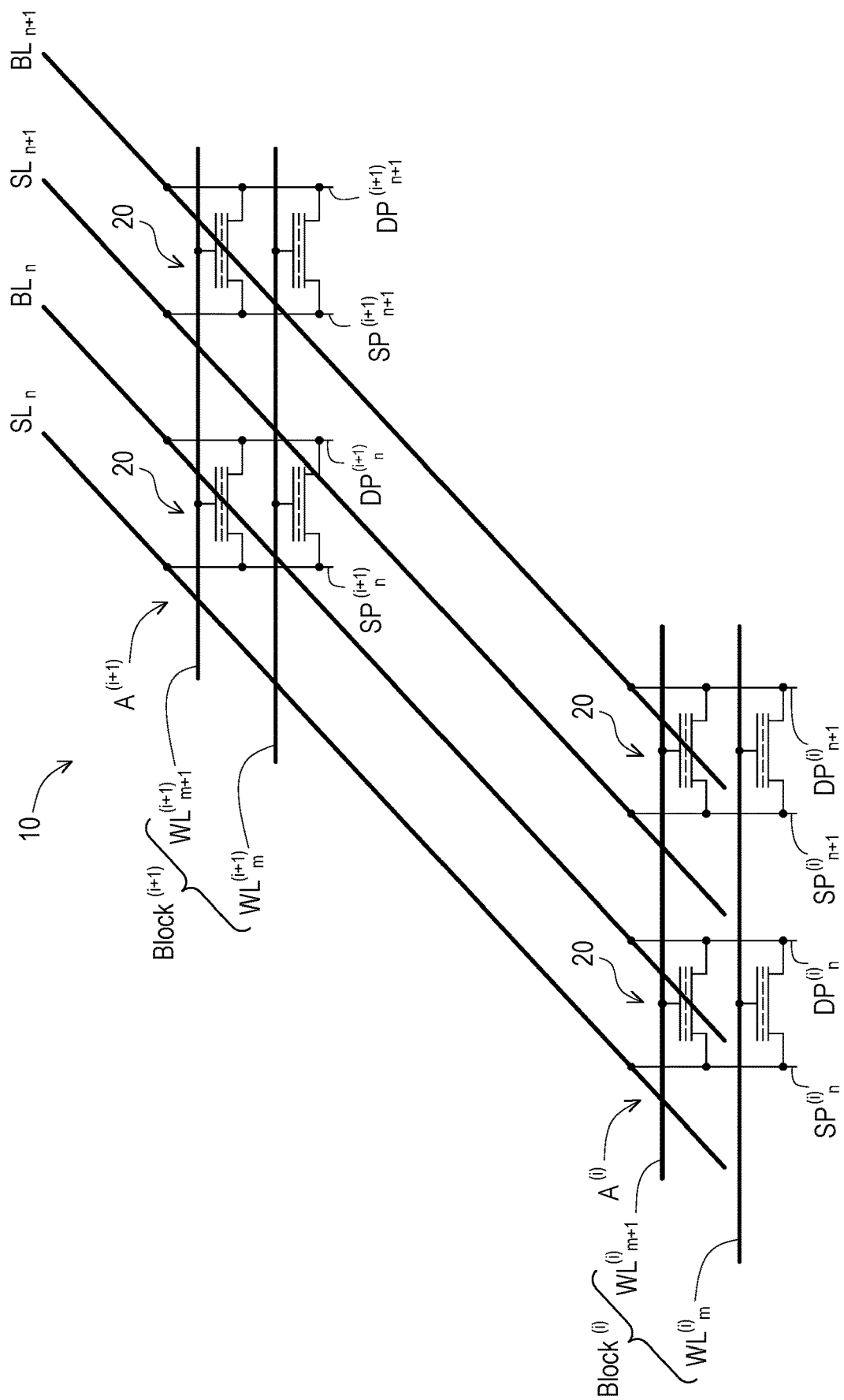
FIG. 1A shows a circuit diagram of a 3D AND flash memory array according to some embodiments in according to the present disclosure.
Figure 1B:
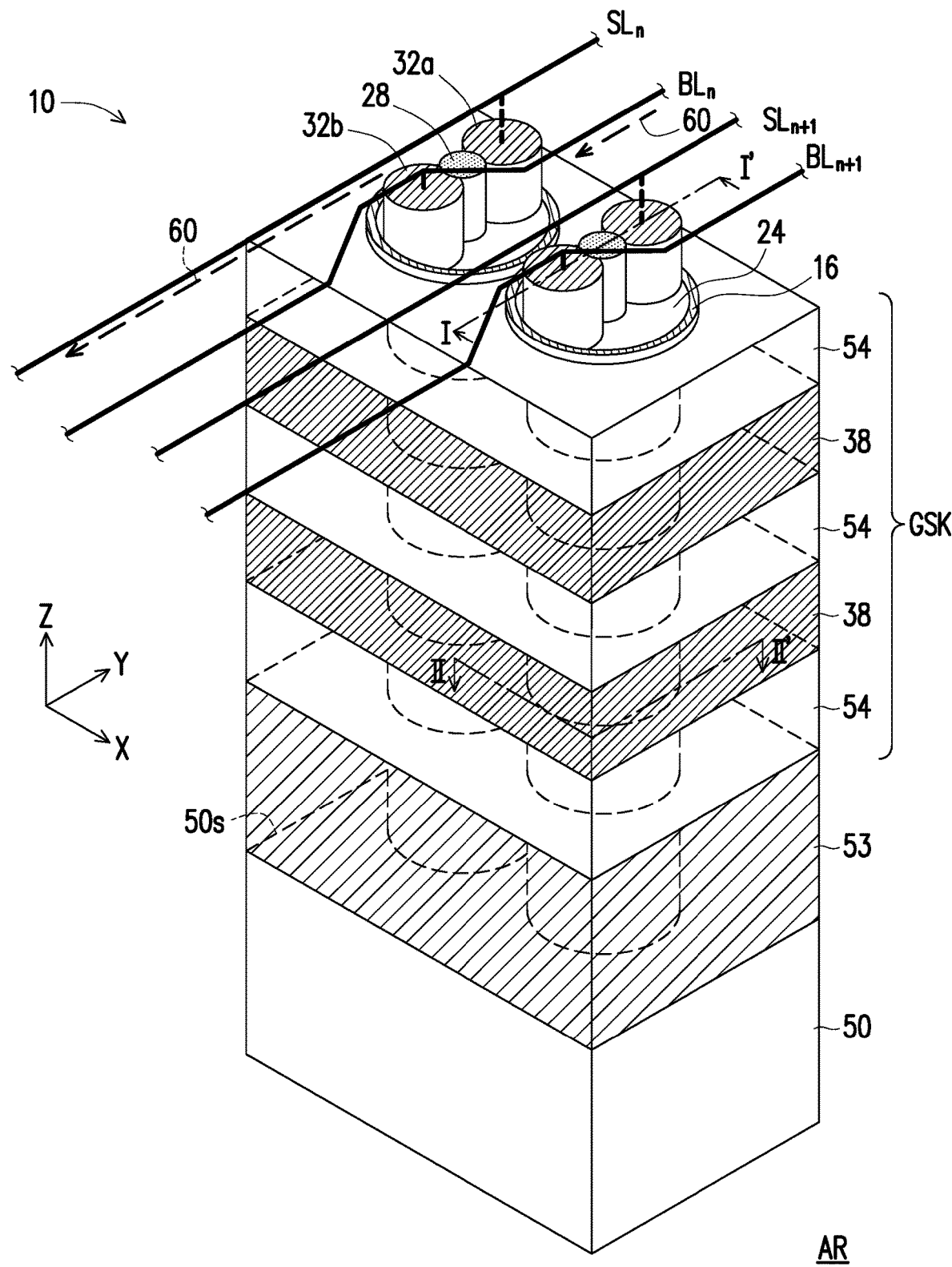
FIG. 1B shows a partial 3D view of the memory array in FIG. 1A.
Figure 1C:
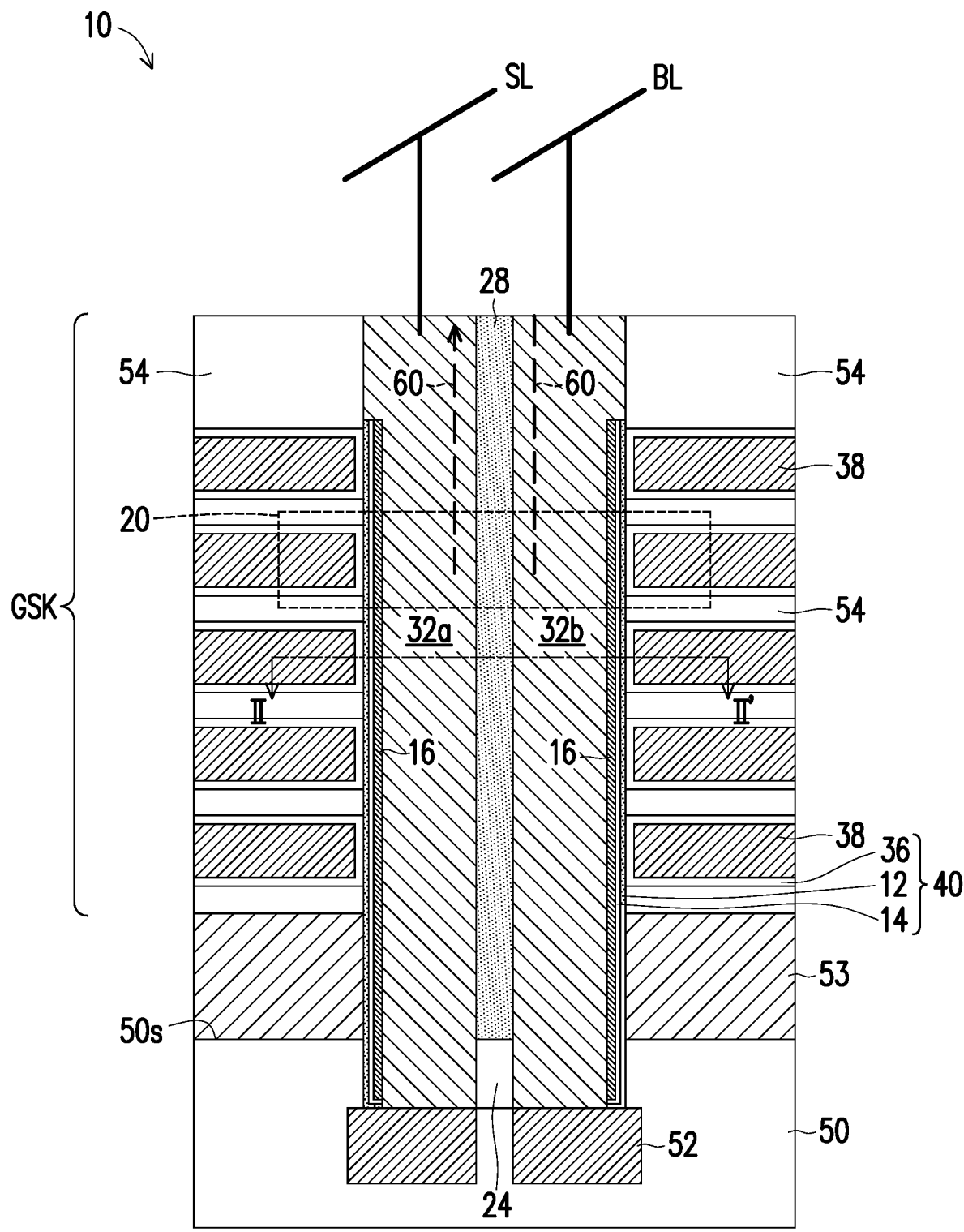
FIG. 1C and FIG. 1D show cross-sectional views taken along line I-I' of FIG. 1B.
Figure 1D:
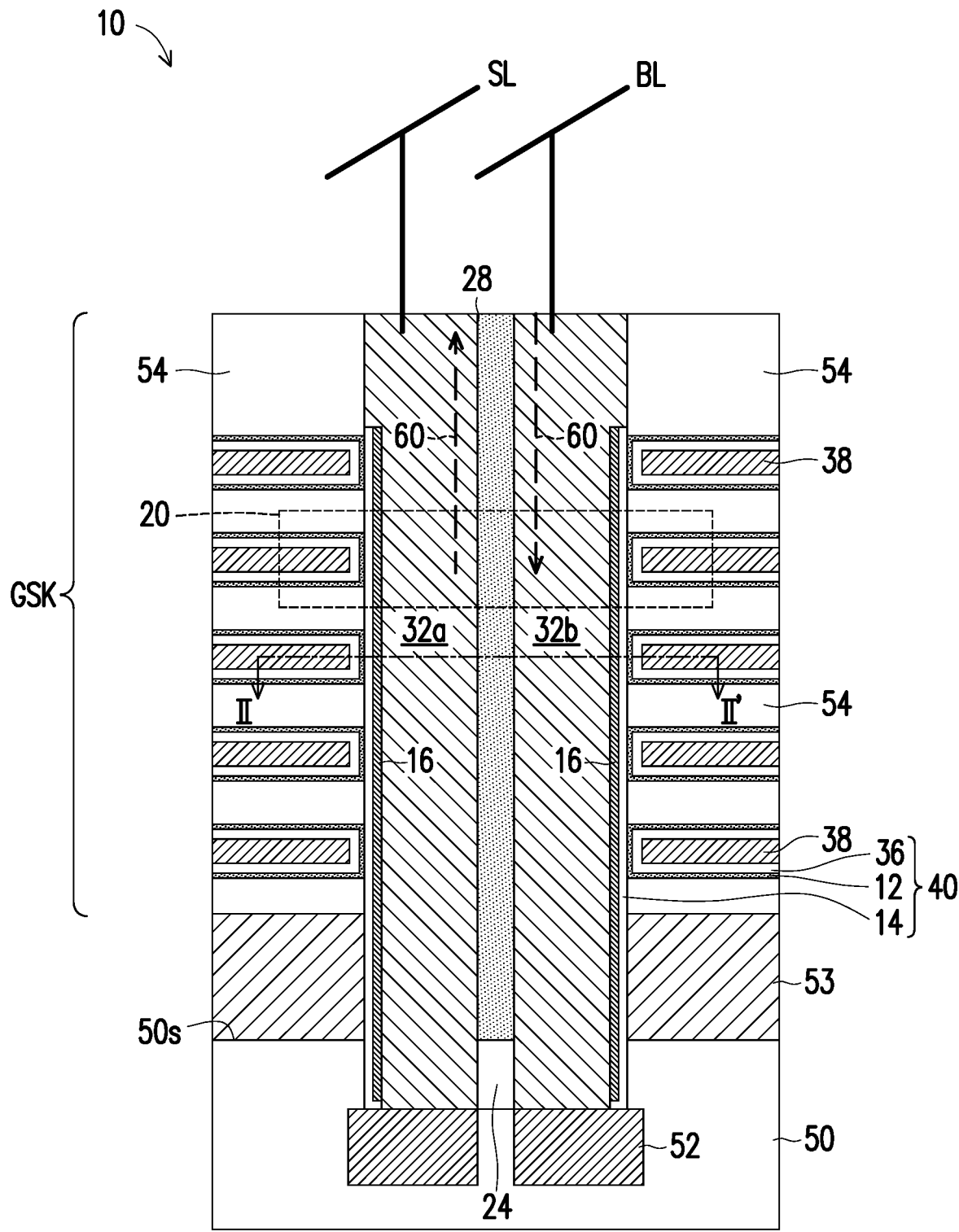
Figure 1E:
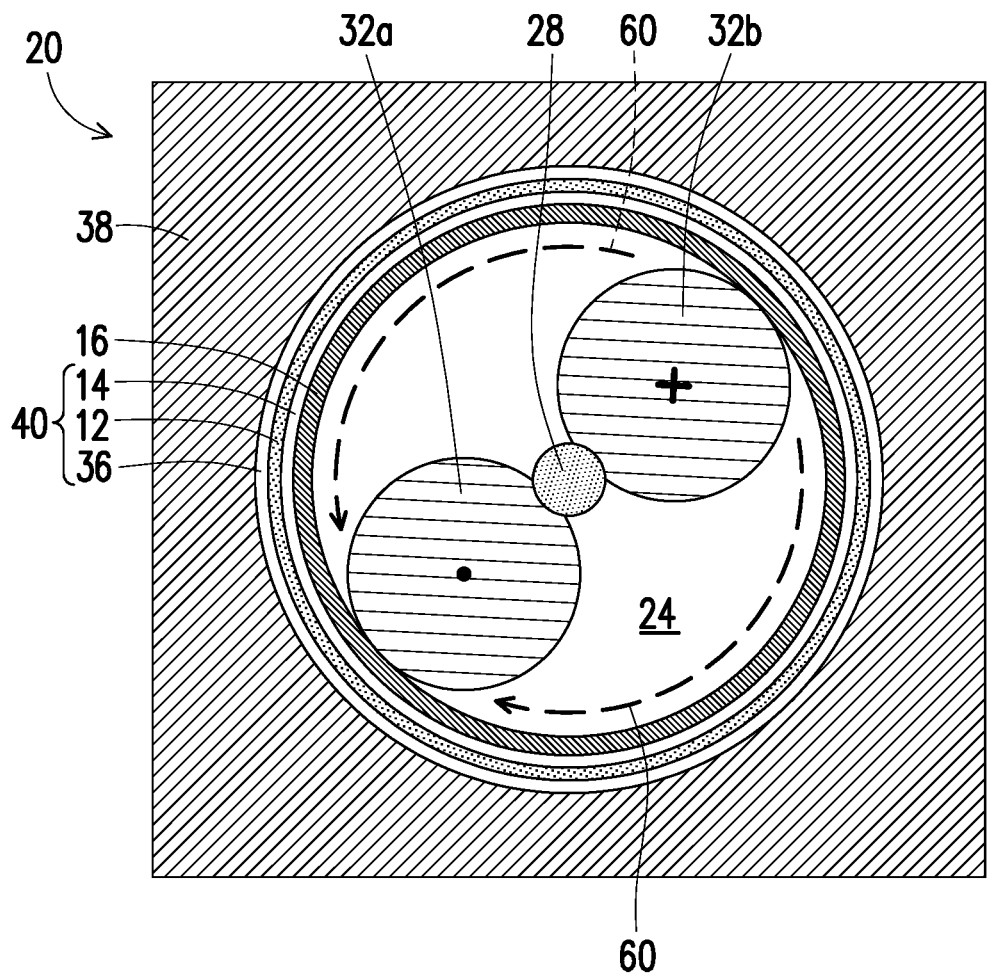
FIG. 1E shows a top view of line II-II' of FIG. 1B, FIG. 1C and FIG. 1D.

FIG. 1A shows a circuit diagram of a 3D AND flash memory array according to some embodiments in according to the present disclosure. FIG. 1B shows a partial three dimensional view of the memory array in FIG. 1A. FIG. 1C and FIG. 1D show cross-sectional views taken along line I-I' of FIG. 1B. FIG. 1E shows a top view of line II-II' of FIG. 1B, FIG. 1C and FIG. 1D.

FIG. 1A shows a schematic view of two blocks BLOCK$^{(i)}$ and BLOCK$^{(i+1)}$ of a vertical pillar array such as a vertical AND memory array 10 arranged in rows and columns. The block BLOCK$^{(i)}$ includes a memory array A$^{(i)}$. A row (e.g., an (m+1)$^{th}$ row) of the memory array A$^{(i)}$ is a set of AND memory cells 20 having a common word line (e.g., WL$^{(i)}_{m+1}$). The AND memory cells 20 of the memory array AC$^{(i)}$ in each row (e.g., the (m+1)$^{th}$ row) correspond to a common word line (e.g., WL$^{(i)}_{m+1}$) and are coupled to different source pillars (e.g., SP$^{(i)}_{n}$ and SP$^{(i)}_{n+1}$) and drain pillars (e.g., DP$^{(i)}_{n}$ and DP$^{(i)}_{n+1}$), so that the AND memory cells 20 are logically arranged in a row along the common word line (e.g., WL$^{(i)}_{m+1}$).

A column (e.g., an n$^{th}$ column) of the memory array AC$^{(i)}$ is a set of AND memory cells 20 having a common source pillar (e.g., SP$^{(i)}_{n}$) and a common drain pillar (e.g., DP$^{(i)}_{n}$). The AND memory cells 20 of the memory array A$^{(i)}_{n}$) in each column (e.g., the n$^{th}$ column) correspond to different word lines (e.g., WL$^{(i)}_{m+1}$ and WL$^{(i)}_{m}$) and are coupled to a common source pillar (e.g., SP$^{(i)}_{n}$) and a common drain pillar (e.g., DP$^{(i)}_{n}$). Hence, the AND memory cells 20 of the memory array A$^{(i)}$ are logically arranged in a column along the common source pillar (e.g., SP$^{(i)}_{n}$) and the common drain pillar (e.g., DP$^{(i)}_{n}$). In the physical layout, according to the manufacturion method as applied, the columns or rows may be twisted and arranged in a honeycomb pattern or other patterns for high density or other reasons.

In FIG. 1A, in the block BLOCK$^{(i)}$, the AND memory cells 20 in the n$^{th}$ column of the memory array A$^{(i)}$ share a common source pillar (e.g., SP$^{(i)}_{n}$) and a common drain pillar (e.g., DP$^{(i)}_{n}$). The AND memory cells 20 in an (n+1)$^{th}$ column share a common source pillar (e.g., SP$^{(i)}_{n+1}$) and a common drain pillar (e.g., DP$^{(i)}_{n+1}$).

The common source pillar (e.g., SP$^{(i)}_{n}$) is coupled to a common source line (e.g., SL$_n$) and the common drain pillar (e.g., DP$^{(i)}_{n}$) is coupled to a common bit line (e.g., BL$_n$). The common source pillar (e.g., SP$^{(i)}_{n+1}$) is coupled to a common source line (e.g., SL$_{n+1}$) and the common drain pillar (e.g., DP$^{(i)}_{n+1}$) is coupled to a common bit line (e.g., BL$_{n+1}$).

Likewise, the block BLOCK$^{(i)}$ includes a memory array A$^{(i)}$, which is similar to the memory array A$^{(i)}$ in the block BLOCK$^{(i)}$. A row (e.g., an (m+1)$^{th}$ row) of the memory array A$^{(i+1)}$ is a set of AND memory cells 20 having a common word line (e.g., WL$^{(i+1)}_{m+1}$). The AND memory cells 20 of the memory array A$^{(i+1)}$ in each row (e.g., the (m+1)$^{th}$ row) correspond to a common word line (e.g., WL$^{(i+1)}_{m+1}$) and are coupled to different source pillars (e.g., SP$^{(i+1)}_{n}$ and SP$^{(i+1)}_{n+1}$) and drain pillars (e.g., DP$^{(i+1)}_{n}$ and DP$^{(i+1)}_{n+1}$). A column (e.g., an n$^{th}$ column) of the memory array A$^{(i+1)}$ is a set of AND memory cells 20 having a common source pillar (e.g., SP$^{(i+1)}_{n}$) and a common drain pillar (e.g., DP$^{(i+1)}_{n}$). The AND memory cells 20 are integrated and connected in parallel, and thus may be also referred to as a memory string. The AND memory cells 20 of the memory array A$^{(i+1)}$ in each column (e.g., the n$^{th}$ column) correspond to different word lines (e.g., WL$^{(i+1)}_{m+1}$ and WL$^{(i+1)}_{m}$) and are coupled to a common source pillar (e.g., SP$^{(i+1)}_{n}$) and a common drain pillar (e.g., DP$^{(i+1)}_{n}$). Hence, the AND memory cells 20 of the memory array A$^{(i+1)}$ are logically arranged in a column along the common source pillar (e.g., SP$^{(i+1)}_{n}$) and the common drain pillar (e.g., DP$^{(i+1)}_{n}$).

The block BLOCK$^{(i+1)}$ and the block BLOCK$^{(i)}$ share source lines (e.g., SL$_n$ and SL$_{n+1}$) and bit lines (e.g., BL$_n$ and BL$_{n+1}$). Therefore, the source line SL$_n$ and the bit line BL$_n$ are coupled to the n$^{th}$ column of AND memory cells 20 in the AND memory array A$^{(i)}$ of the block BLOCK$^{(i)}$, and are coupled to the n$^{th}$ column of AND memory cells 20 in the AND memory array A$^{(i+1)}$ of the block BLOCK$^{(i+1)}$. Similarly, the source line SL$_{n+1}$ and the bit line BL$_{n+1}$ are coupled to the (n+1)$^{th}$ column of AND memory cells 20 in the AND memory array A$^{(i)}$ of the block BLOCK$^{(i)}$, and are coupled to the (n+1)$^{th}$ column of AND memory cells 20 in the AND memory array A$^{(i+1)}$ of the block BLOCK$^{(i+1)}$.

Referring to FIG. 1B to FIG. 1D, the memory array 10 may be disposed over an interconnect structure of a semiconductor die, for example, being disposed on one or more active devices (e.g., transistors) formed on a semiconductor substrate. Therefore, the dielectric substrate 50 is, for example, a dielectric layer (e.g., a silicon oxide layer) over a conductive interconnect structure formed on a silicon substrate. The memory array 10 may include a gate stack structure GSK, a plurality of channel pillars 16, a plurality of first conductive pillars (also referred to as source pillars) 32a, a plurality of second conductive pillars (also referred to as drain pillars) 32b, and a plurality of charge storage structures 40.

Referring to FIG. 1B, the gate stack structure GSK is formed on the dielectric substrate 50 in the memory array region AR. The gate stack structure GSK includes a plurality of gate layers (also referred to as word lines) 38 and a plurality of insulating layer 54 vertically stacked on a surface 50s of the dielectric substrate 50. In a direction Z, the gate layers 38 are electrically isolated from each other by the insulating layer 54 disposed therebetween. The gate layers 38 extend in a direction parallel to the surface 50s of the dielectric substrate 50. The gate layers 38 may have a staircase structure (not shown). Therefore, a lower gate layer 38 is longer than an upper gate layer 38, and the end of the lower gate layer 38 extends laterally beyond the end of the upper gate layer 38. A contact (not shown) for connecting the gate layer 38 may land on the end of the gate layer 38 to connect the gate layers 38 respectively to conductive lines.

Referring to FIG. 1B to FIG. 1D, the memory array 10 further includes a plurality of channel pillars 16 stacked along the direction Z. In some embodiments, each of the channel pillars 16 has an annular shape from a top view. A material of the channel pillars includes a semiconductor material, such as undoped polysilicon.

Referring to FIG. 1B to FIG. 1D, the memory array 10 further includes an insulating pillar 28, a plurality of first conductive pillars 32a, and a plurality of second conductive pillars 32b. In this example, the first conductive pillars 32a serve as source pillars. The second conductive pillars 32b serve as drain pillars. The first conductive pillar 32a, the second conductive pillar 32b and the insulating pillar 28 are each extend in a direction (i.e., the direction Z) perpendicular to the surface of the gate layer 38. The first conductive pillar 32a and the second conductive pillar 32b are separated from each other by the insulating pillar 28. The first conductive pillar 32a and the second conductive pillar 32b are electrically connected to the channel pillars 16. The first conductive pillar 32a and the second conductive pillar 32b further extend through a conductive layer 53 between the gate stack structure GSK and the dielectric substrate 50, and land on the stop layer 52 below the conductive layer 53. The first conductive pillar 32a and the second conductive pillar 32b include doped polysilicon or metal materials. The insulating pillar 28 is, for example, silicon nitride.

Referring to FIG. 1C and FIG. 1D, the charge storage structures 40 are disposed between the channel pillars 16 and the gate layers 38. Each of the charge storage structure 40 may include a tunneling layer (or referred to as a bandgap engineered tunneling oxide layer) 14, a charge storage layer 12, and a blocking layer 36. The charge storage layer 12 is located between the tunneling layer 14 and the blocking layer 36. In some embodiments, the tunneling layer 14 and the blocking layer 36 include silicon oxide. The charge storage layer 12 includes silicon nitride or other materials capable of trapping charges. In some embodiments, as shown in FIG. 1C, a portion (the tunneling layer 14 and the charge storage layer 12) of the charge storage structure 40 continuously extends in a direction (i.e., the direction Z) perpendicular to the gate layer 38, and the other portion (the blocking layer 36) of the charge storage structure 40 surrounds the gate layer 38. In other embodiments, as shown in FIG. 1D, the charge storage structure 40 (the tunneling layer 14, the charge storage layer 12, and the blocking layer 36) surrounds the gate layer 38.

Referring to FIG. 1E, the charge storage structure 40, the channel pillar 16, the source pillar 32a, and the drain pillar 32b are surrounded by the gate layer 38, and a memory cell 20 is defined. According to different operation methods, a 1-bit operation or a 2-bit operation may be performed on the memory cell 20. For example, when a voltage is applied to the source pillar 32a and the drain pillar 32b, since the source pillar 32a and the drain pillar 32b are connected to the channel pillar 16, electrons may be transferred along the channel pillar 16 and stored in the entire charge storage structure 40. Accordingly, a 1-bit operation may be performed on the memory cell 20. In addition, for an operation involving Fowler-Nordheim tunneling, electrons or holes may be trapped in the charge storage structure 40 between the source pillar 32a and the drain pillar 32b. For an operation involving source side injection, channel-hot-electron injection, or band-to-band tunneling hot carrier injection, electrons or holes may be locally trapped in the charge storage structure 40 adjacent to one of the source pillar 32a and the drain pillar 32b. Accordingly, a single level cell (SLC, 1 bit) or multi-level cell (MLC, greater than or equal to 2 bits) operation may be performed on the memory cell 20.

Referring to FIG. 1A and FIG. 1B, during operation, a voltage is applied to a selected word line (gate layer) 38; for example, when a voltage higher than a corresponding threshold voltage (Vth) of the corresponding memory cell 20 is applied, the channel pillar 16 intersecting the selected word line 38 is turned on to allow a current to enter the drain pillar 32b from the bit line $BL_n$ or $BL_{n+1}$ (shown in FIG. 1B), flow to the source pillar 32a via the turned-on channel region (e.g., in a direction indicated by arrow 60), and finally flow to the source line $SL_n$ or $SL_{n+1}$ (shown in FIG. 1B).

Figure 1F:
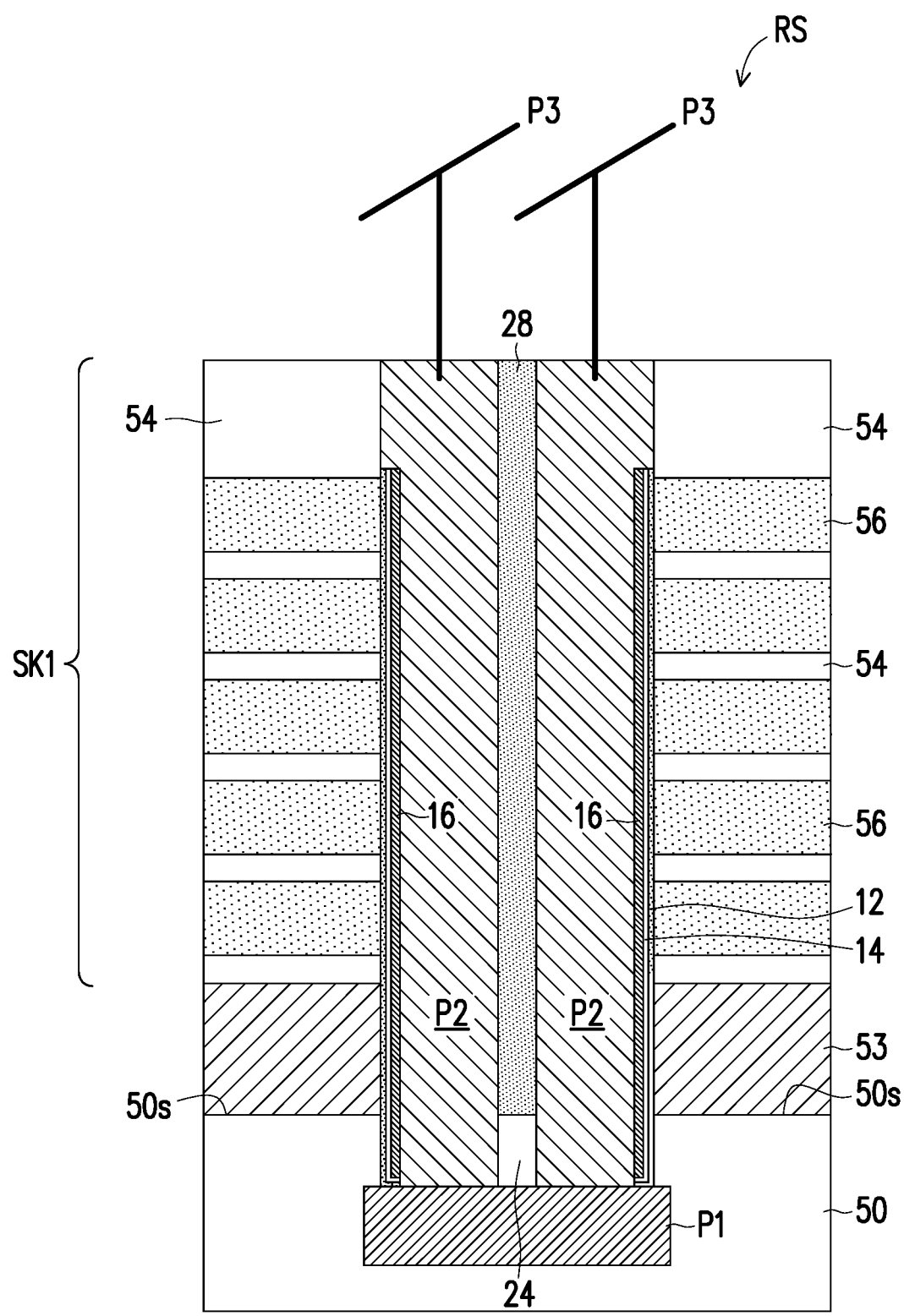
FIG. 1F and FIG. 1G are cross-sectional views illustrating a resistor in the peripheral region of a 3D AND flash memory according to some embodiments of the present invention.
Figure 1G:
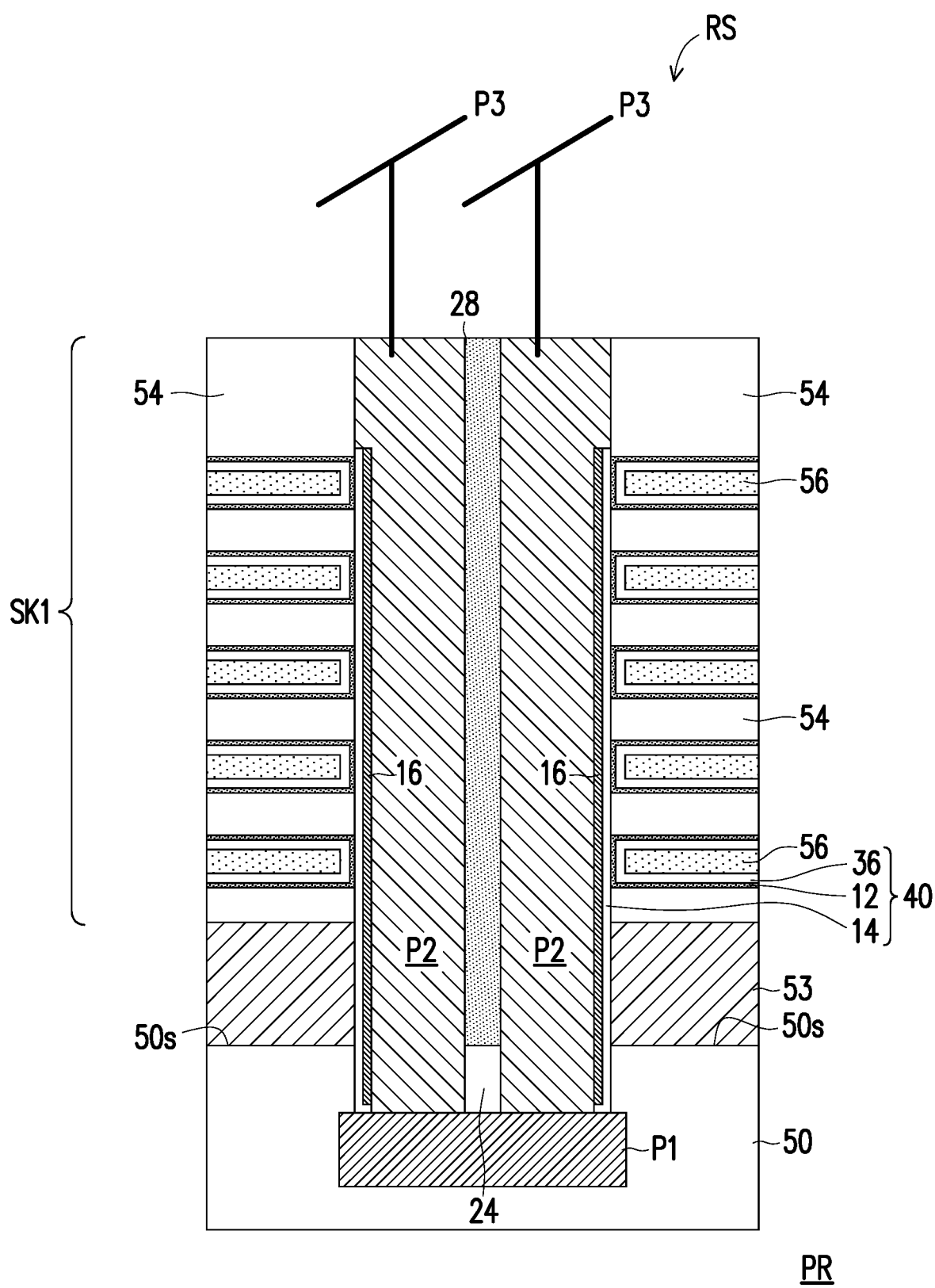

FIG. 1F and FIG. 1G are cross-sectional views illustrating the resistor in the peripheral region of the 3D AND flash memory according to some embodiments of the present invention.

Referring to FIG. 1F and FIG. 1G, in an embodiment of the present invention, a resistor RS is further formed in a peripheral region PR next to the memory array. The resistor RS has a serpentine shape. The resistor RS passes through an intermediate stack structure SK1 and the conductive layer 53 in the peripheral region PR, and is laterally adjacent to the memory array 10 in FIG. 1C and FIG. 1D. Moreover, the resistor RS also extends above and below the intermediate stack structure SK1 formed by the insulating layers 54 and the interlayers 56. In other words, the resistor RS includes three portions. The first portion P1 is disposed below the intermediate stack structure SK1. The second portion P2 is disposed in the intermediate stack structure SK1. The third portion P3 is disposed above the intermediate stack structure SK1.

FIG. 2A to FIG. 2H are cross-sectional views of a manufacturing process of a semiconductor device according to an embodiment of the present disclosure.

Figure 2A:
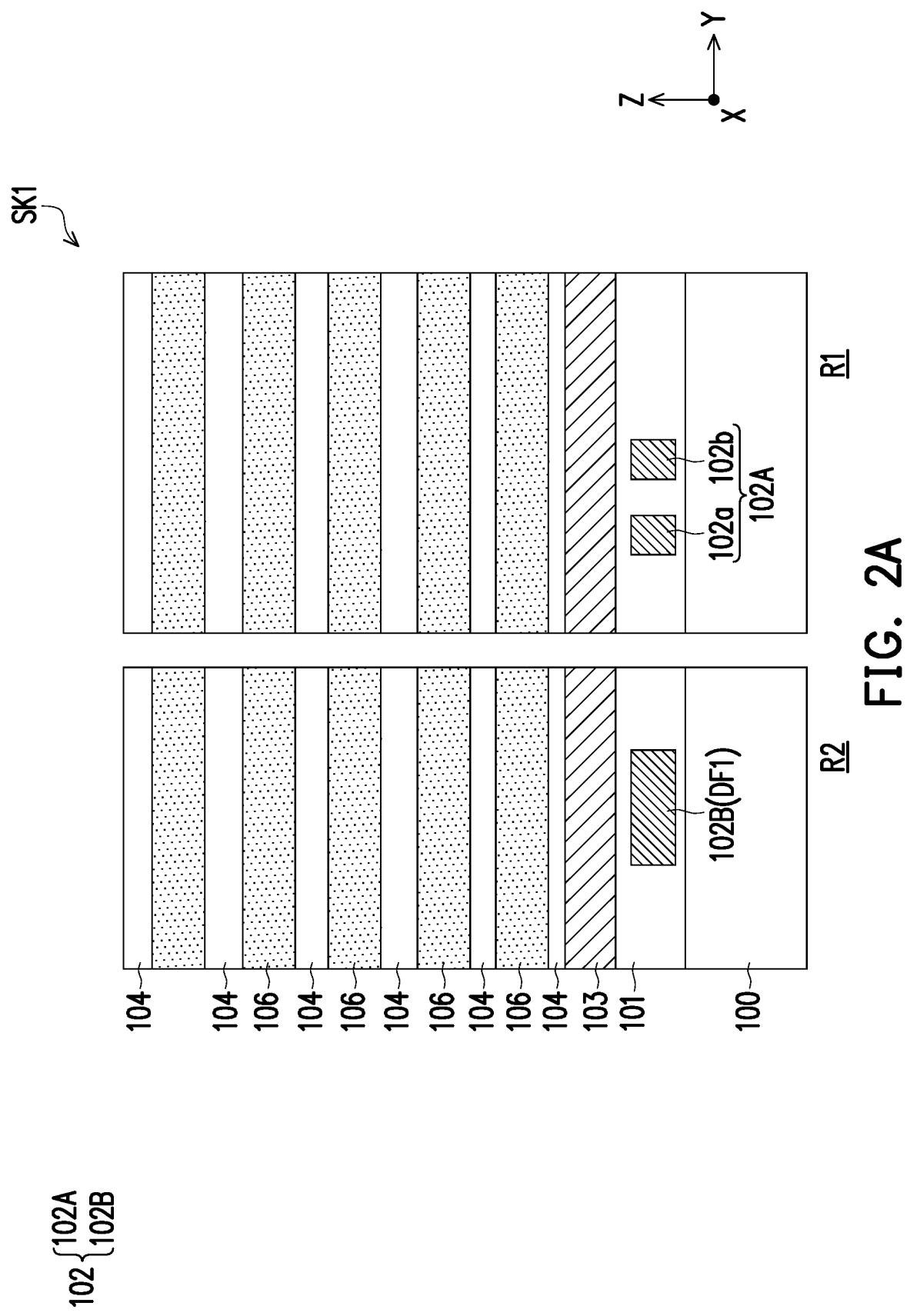
FIG. 2A to FIG. 2H are cross-sectional views of a manufacturing process of a semiconductor device according to an embodiment of the present disclosure.

Referring to FIG. 2A, a dielectric substrate 100 is provided. The dielectric substrate 100 is, for example, a dielectric layer (e.g., a silicon oxide layer) of a metal interconnect structure formed on a silicon substrate. The dielectric substrate 100 includes a first region R1 and a second region R2. The first region R1 is an operation region and the second region R2 is a peripheral region, for example. In some embodiments, the first region R1 is used for forming a vertical pillar array, and the vertical pillar array is, for example, a memory array. The second region R2 is used for forming a resistor.

The stack structure SK1 is formed on the dielectric substrate 100 in the first region R1 and the second region R2. The stack structure SK1 may be also referred to as an intermediate stack structure SK1. In this embodiment, the stack structure SK1 is composed of insulating layers 104 and interlayers 106 that are alternately stacked alternately stacked on the dielectric substrate 100 in order. In other embodiments, the stack structure SK1 may be composed of the interlayers 106 and the insulating layers 104 that are alternately stacked on the dielectric substrate 100 in order. In addition, in this embodiment, the uppermost layer of the stack structure SK1 is the insulating layer 104. In this embodiment, the stack structure SK1 has six insulating layers 104 and five interlayers 106, but the disclosure is not limited thereto. In other embodiments, more insulating layers 104 and more interlayers 106 may be formed according to the actual requirements. The insulating layers 104 are silicon oxide, for example. The interlayers 106 are silicon nitride, for example. The interlayers 106 may serve as sacrificial layers which may be partially or entirely removed in the subsequent process.

Referring to FIG. 2A, in some embodiments, before the stack structure SK1 is formed, an insulating layer 101, a stop layer 102 and a conductive layer 103 are formed on the dielectric substrate 100. The material of the insulating layer 101 is, for example, silicon oxide. The stop layer 102 is formed in the insulating layer 101. The material of the stop layer 102 is polysilicon, for example. The stop layer 102 includes a conductive pattern 102A in the first region R1 and a conductive pattern 102B in the second region R2.

Figure 3A:
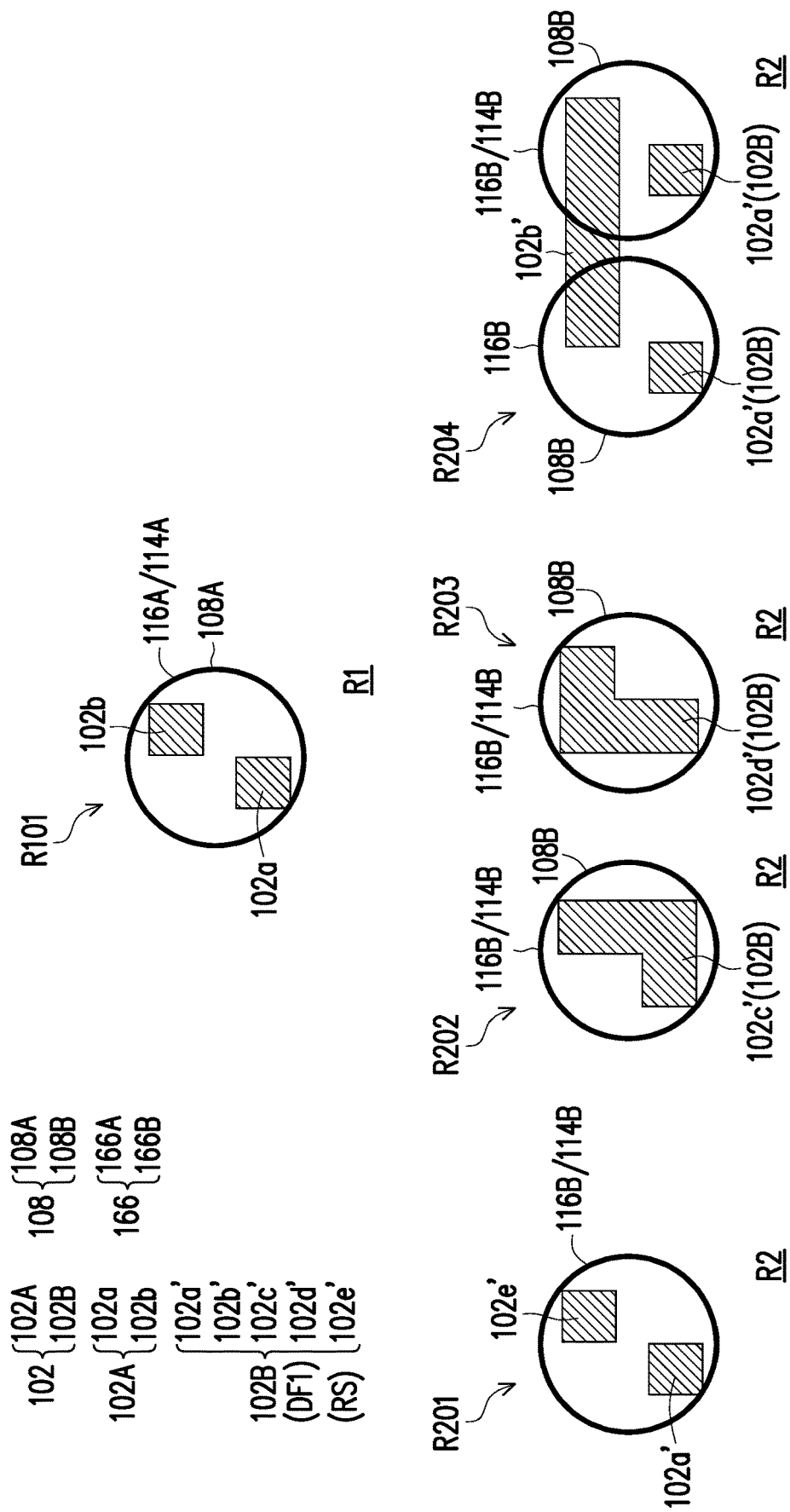
FIG. 3A and FIG. 3B are top views of various partial regions of a semiconductor device according to embodiments of the present disclosure.
Figure 3B:
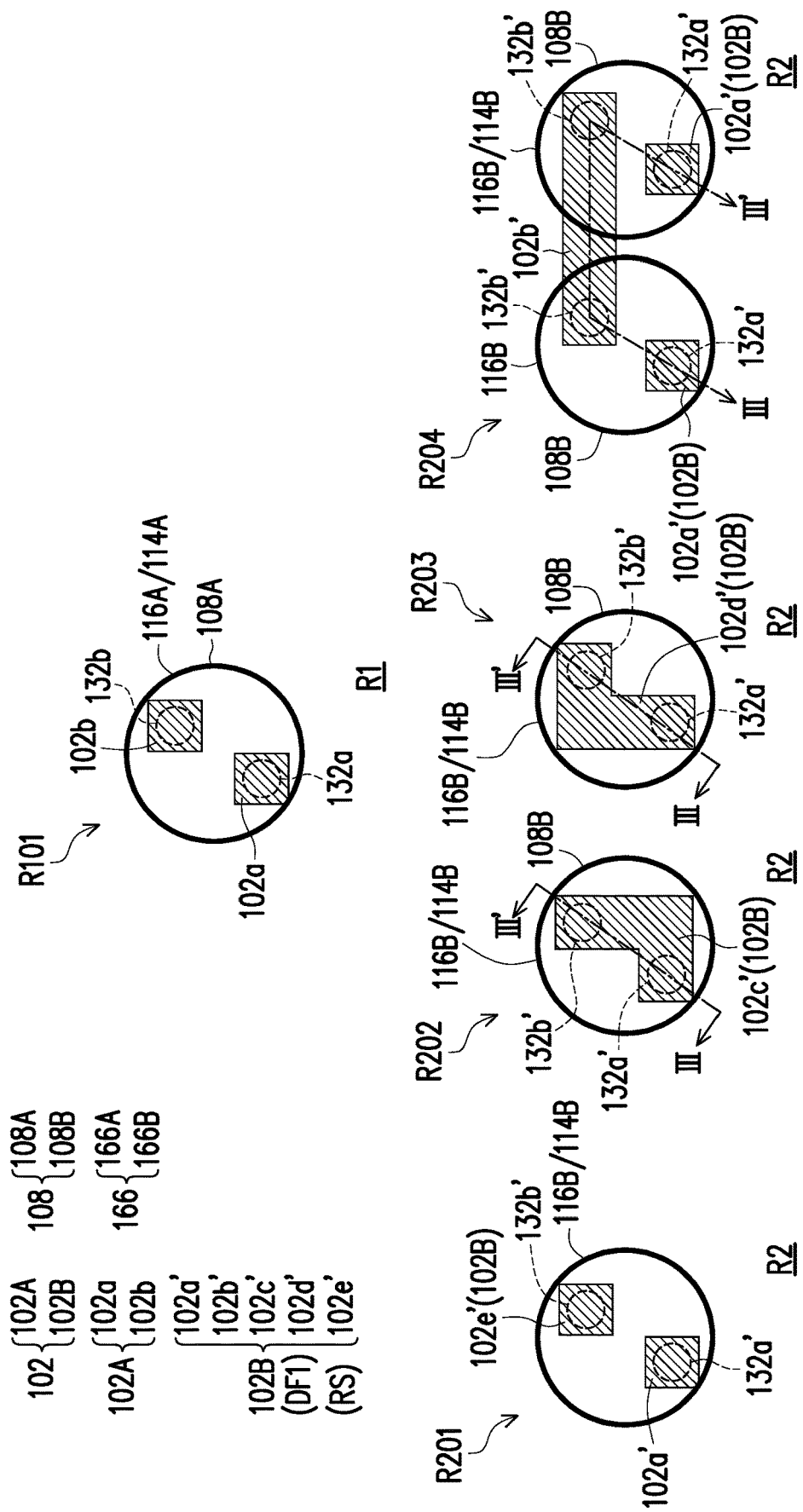

FIG. 3A and FIG. 3B are top views of various partial regions of a semiconductor device according to embodiments of the present disclosure.

Referring to FIG. 3A, the conductive pattern 102A in the first region R1 may serve as a stop layer for the subsequent etching process. The conductive pattern 102A may include stop layers 102a and 102b separated from each other. The conductive pattern 102A has, for example, an island shape. The conductive pattern 102B in the second region R2 may be also referred to as a first conductive feature DF1. The first conductive feature DF1 may include conductive features 102a', 102b', 102c', 102d' and/or 102e'. The first conductive feature DF1 may serve as the first portion P1 of the resistor RS. The conductive feature 102a', 102e' has an island shape, for example. The conductive feature 102b' has an I shape, for example. The conductive feature 102c', 102d' has an L shape, for example.

Figure 2B:
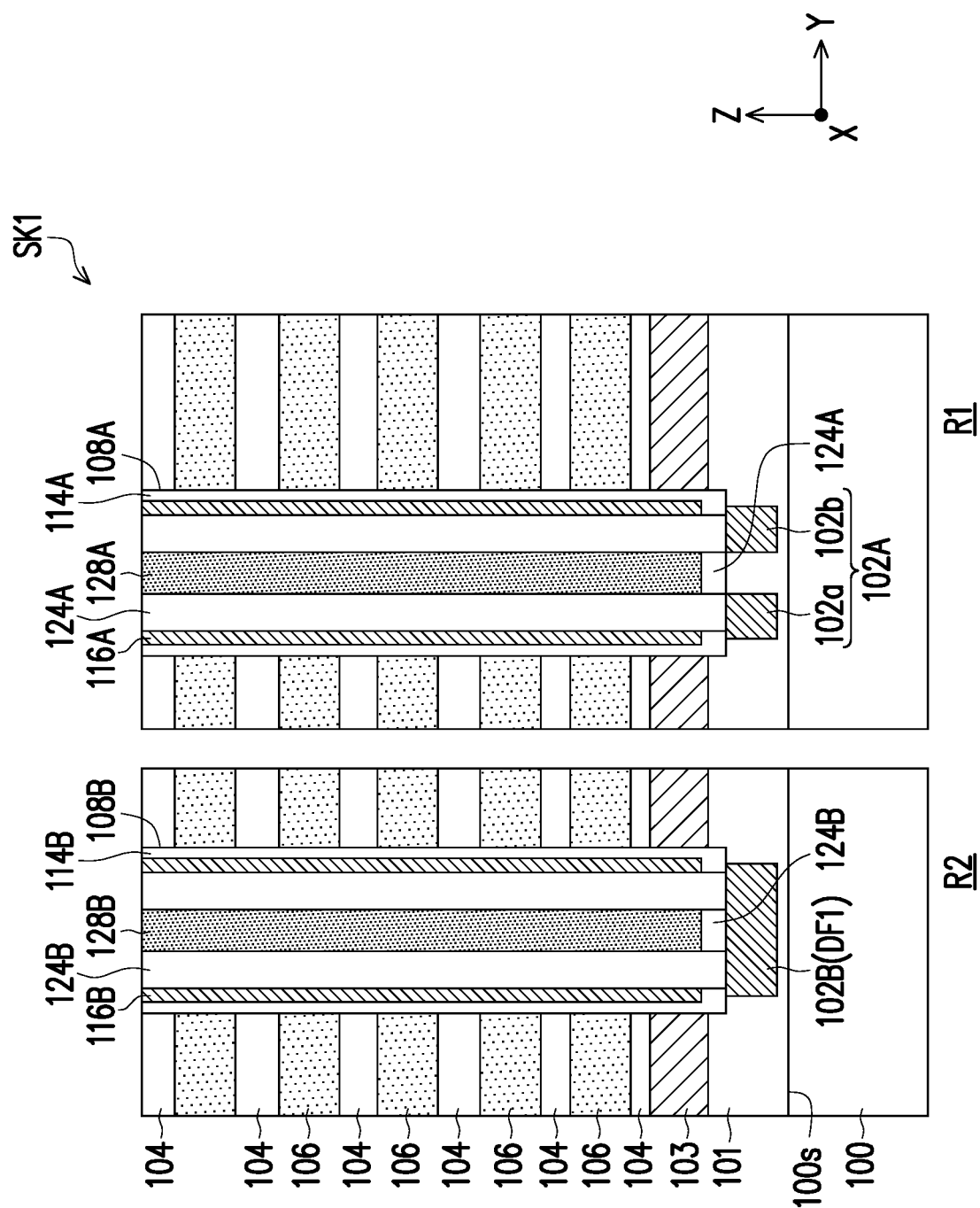

Referring to FIG. 2B, the conductive layer 103 is a polysilicon layer which is ground. The conductive layer 103 may be also referred to as a dummy gate. The stack structure SK1 in the first region R1 is then patterned to form a staircase structure (not shown).

Next, referring to FIG. 2B, a plurality of openings 108 are formed in the stack structure SK1. In this embodiment, the opening 108 extends through the stack structure SK1 and the conductive layer 103. In this embodiment, from a top view, the opening 108 has a circular profile as shown in FIG. 3A, but the disclosure is not limited thereto. In other embodiments, the opening 108 may have other profile such as a polygonal profile (not shown). The opening 108 includes an opening 108A located in the first region R1 and an opening 108B located in the second region R2. The shape of the opening 108A may be the same as or different from the shape of the opening 108B.

Referring to FIG. 2B, a tunneling layer 114 and a channel pillar 116 are formed in the opening 108. The tunneling layer 114 includes a tunneling layer 114A located in the opening 108A and a dummy tunneling layer 114B located in the opening 108B. The channel pillar 116 includes a channel pillar 116A located in the opening 108A and a dummy channel pillar 116B located in the opening 108B. The tunneling layer 114 is, for example, a silicon oxide layer. The material of the channel pillar 116 may be semiconductor such as undoped polysilicon. The method of forming the tunneling layer 114 and the channel pillar 116 includes, for example, forming a tunneling material and a channel material on the stack structure SK1 and in the opening 108. Then, an etch-back process is performed to partially remove the tunneling material and the channel material to form the tunneling layer 114 and the channel pillar 116. The tunneling layer 114 and the channel pillar 116 cover the sidewall of the opening 108. The channel pillar 116 may extend through the stack structure SK1 and extend into the insulating layer 101, and thus the bottom of the opening 108 exposes the stop layer 102. The channel pillar 116 may be continuous in its extending direction (e.g., in a direction perpendicular to the dielectric substrate 100). In other words, the channel pillar 116 is integral in its extending direction and is not divided into a plurality of disconnected parts. In a top view, the channel pillar 116 has, for example, a ring shape (not shown).

Referring to FIG. 3A, in some embodiments, the channel pillars 116A and 116B may have a circular profile in a top view, but the disclosure is not limited thereto. In other embodiments, the channel pillars 116A and 116B may also have other profile such as a polygonal profile in a top view (not shown).

Referring to FIG. 3A, in the first region R1, as shown in the partial region R101, within the projection region of the dummy channel pillar 116A (projected onto the surface 100s of the dielectric substrate 100), there may be two conductive patterns 102A (i.e., the stop layers 102a and 102b) separated from each other.

Referring to FIG. 3A, in the second region R2, as shown in the partial region R202 or R203, within the projection region of the dummy channel pillar 116B (projected onto the surface 100s of the dielectric substrate 100), there may be a single first conductive feature DF1 (e.g., the conductive feature 102c' or the conductive feature 102d').

Referring to FIG. 3A, in the second region R2, as shown in the partial region R201 or R204, within the projection region of the dummy channel pillar 116B (projected onto the surface 100s of the dielectric substrate 100), there may be two first conductive features DF1 (e.g., the conductive features 102a' and 102e' or 102a' and 102b') separated from each other.

Referring to FIG. 3A, in some embodiments, in the second region R2, as shown in the partial region 8204, one of the first conductive features DF1 (e.g., the conductive feature 102a') may be located within the projection region of the dummy channel pillar 116B (projected onto the surface 100s of the dielectric substrate 100), and another of the first conductive features DF1 (e.g., the conductive feature 102b') may extend beyond the projection region of the dummy channel pillar 116B, and extend into the projection region of another dummy channel pillar 116B. In other words, one of the first conductive features DF1 (e.g., the conductive feature 102a') may overlap with the projection region of a single dummy channel pillar 116B, and another of the first conductive features DF1 (e.g., the conductive feature 102b') may overlap with the projection regions of two dummy channel pillars 116B.

Referring to FIG. 2B, an insulating filling material is formed on the stack structure SK1 and filled in the opening 108. The insulating filling material is, for example, low temperature silicon oxide. The insulating filling material filled in the opening 108 forms the insulating filling layer 124 and a circular void is left in the center of the insulating filling layer 124. Then, an anisotropic etching process is performed to expand the circular void to form a hole (not shown). The insulating filling layer 124 includes an insulating filling layer 124A located in the opening 108A and an insulating filling layer 124B located in the opening 108B.

Referring to FIG. 2B, an insulating material is formed on the insulating filling layer 124 and in the holes. Then, an anisotropic etching process is performed to remove part of the insulating material to form an insulating pillar 128 in the hole. The material of the insulating pillar 128 is different from that of the insulating filling layer 124. The material of insulating pillar 128 is silicon nitride, for example. The insulating filling layer 124 includes an insulating filling layer 124A located in the opening 108A and an insulating filling layer 124B located in the opening 108B.

Figure 2C:
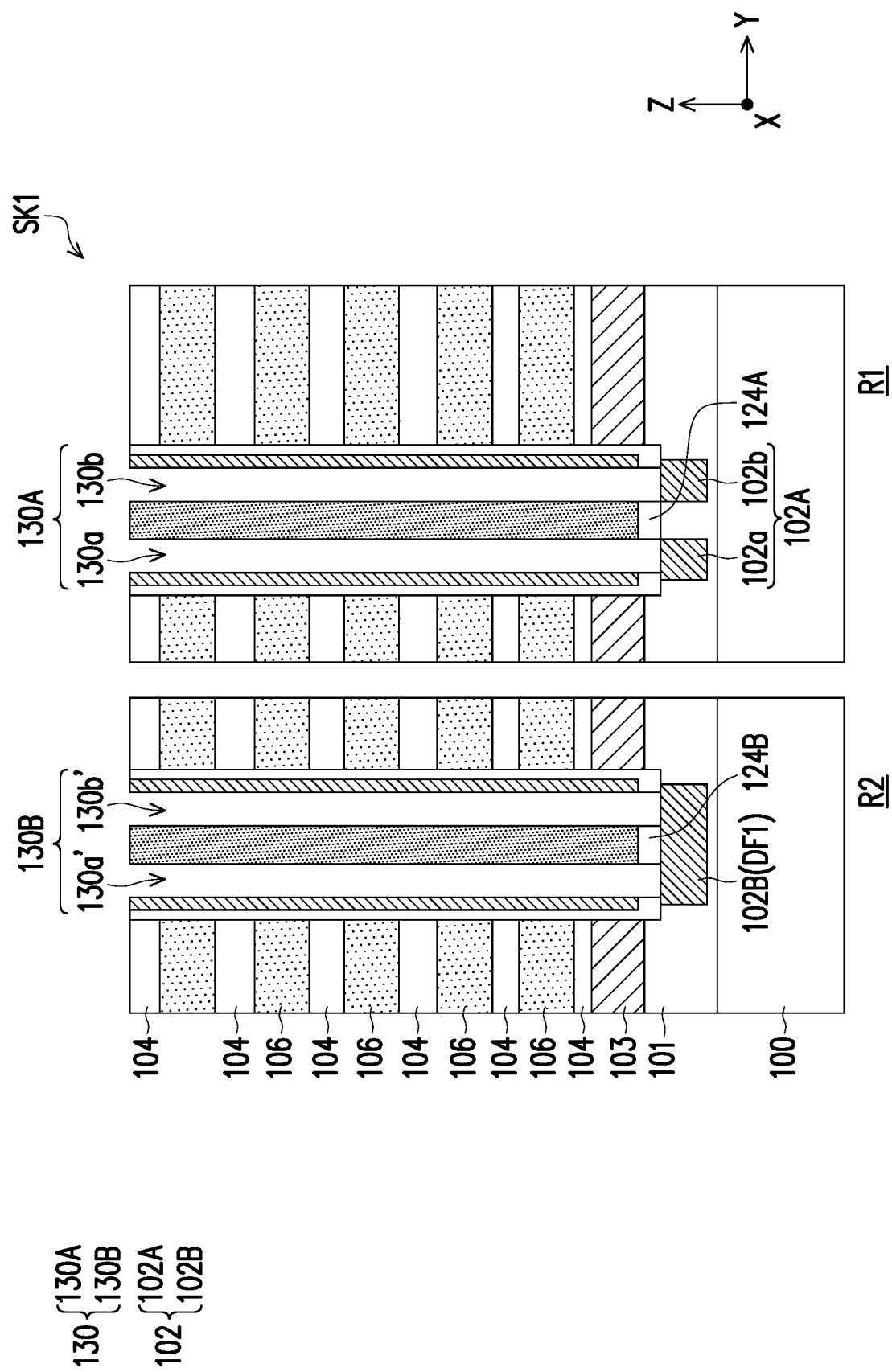

Referring to FIG. 2C, a patterning process (e.g., photolithography and etching processes) is performed to form holes 130 in the insulating filling layer 124. In the etching process, the stop layer 102 may serve as an etching stop layer. Therefore, the formed holes 130 through the stack structure SK1 and extend until the stop layer 102 is exposed. The holes 130 include a hole 130A located in the first region R1 and a hole 130B located in the second region R2. The hole 130A includes holes 130a and 130b respectively exposing the stop layers 102a and 102b. The hole 130B includes holes 130a' and 130b' exposing the conductive feature DF1.

Figure 2D:
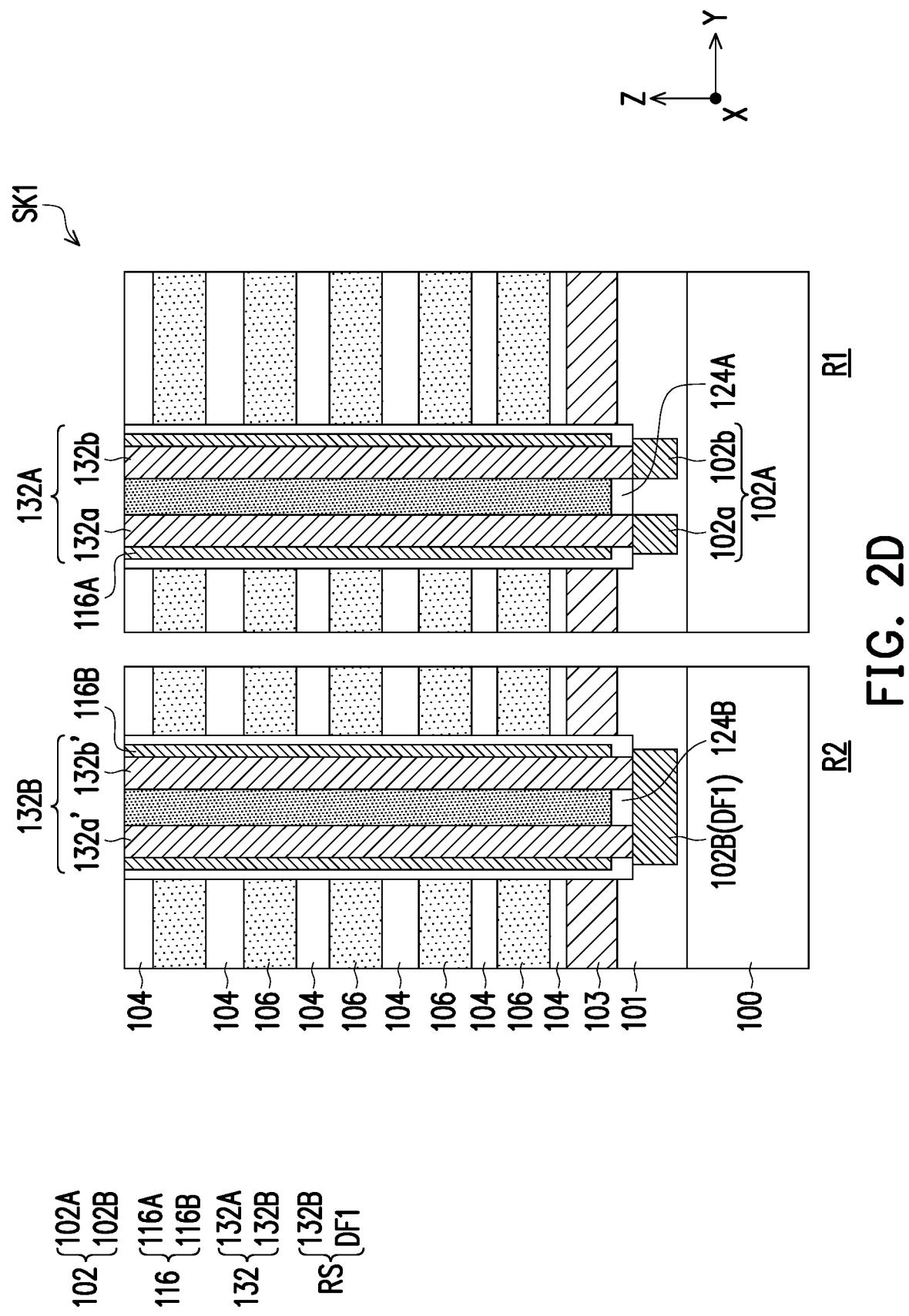

Referring to FIG. 2D, conductive pillars 132 are formed in the holes 130. The conductive pillar 132 may be formed by forming a conductive material on the dielectric substrate 100 and in the hole 130 and performing an etch-back process. The conductive pillar 132 may include doped polysilicon. The conductive pillars 132 include a plurality of conductive pillars 132A located in the first region R1 and a plurality of conductive pillars 132B located in the second region R2. The conductive pillars 132A are served as source pillars and drain pillars, and are electrically connected to the channel pillars 116A. The conductive pillars 132B are electrically connected to the dummy channel pillars 116B. The conductive pillars 132B serve as the second portion P2 of the resistor RS, and are electrically connected to the first conductive features DF1 (i.e., the conductive patterns 102B) serving as the first portion P1 of the resistor RS.

Referring to FIG. 2D and FIG. 3B, the conductive pillars 132A in the first region R1 include conductive pillars 132a and 132b. The conductive pillars 132a and 132b land on the stop layers 102a and 102b of the conductive pattern 102A. The conductive pillars 132a and 132b of the conductive pillar 132A may serve as a source pillar and a drain pillar respectively, and may be electrically connected to the channel pillar 116A respectively.

Referring to FIG. 2D and FIG. 3B, the conductive pillars 132B in the second region R2 include conductive pillars 132a' and 132b'. The conductive pillars 132a' and 132b' respectively land on the first conductive features DF1 (i.e., the conductive patterns 102B). The conductive pillars 132B are electrically connected to the dummy channel pillars 116B respectively.

Referring to FIG. 3B, in the second area R2, as shown in the partial region R201, the conductive pillars 132a' and 132b' in the same dummy channel pillar 116B are respectively connected to the first conductive features 102a' and 102e' in the same dummy channel pillar 116B.

Figure 4A:
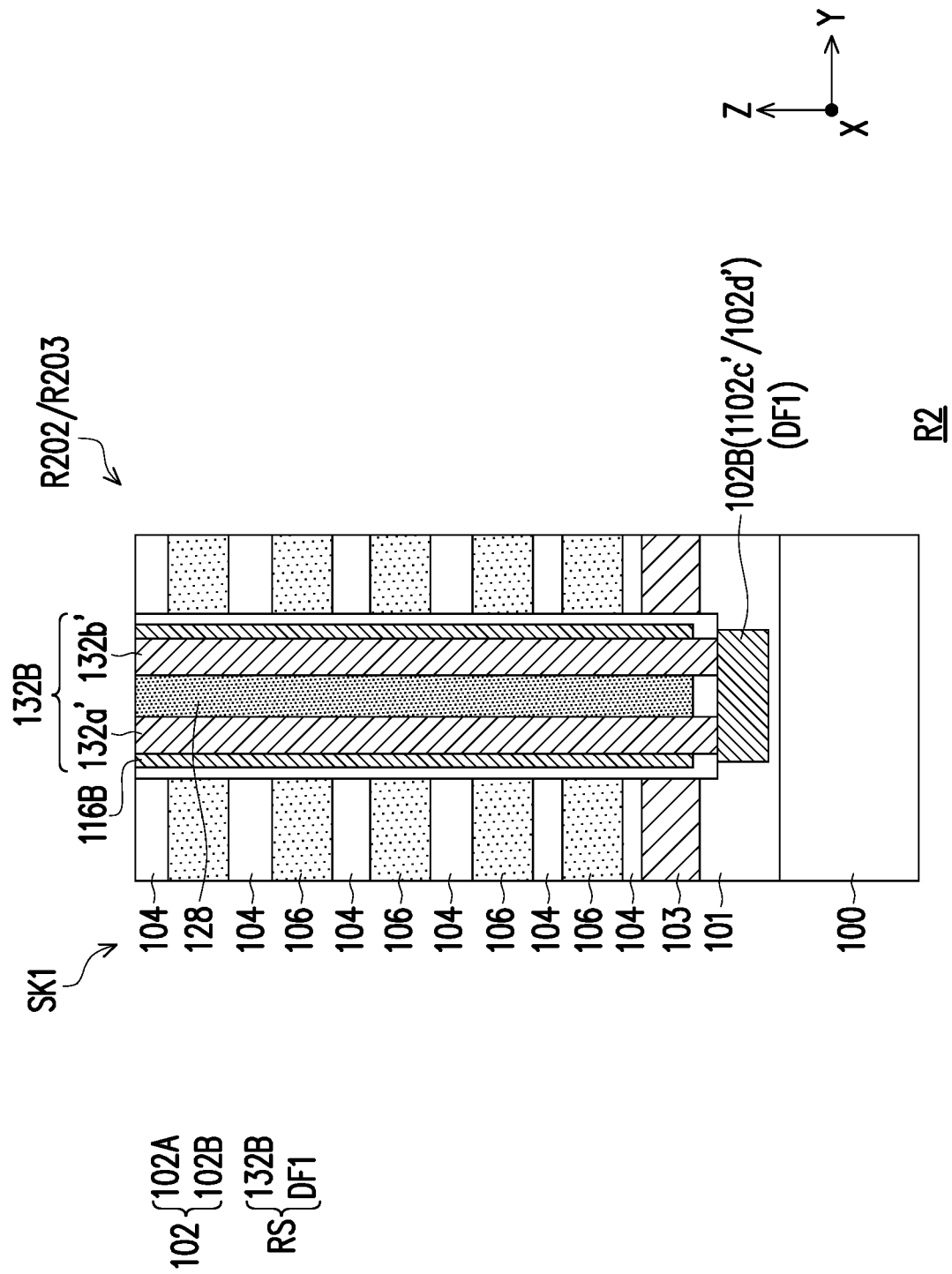
FIG. 4A and FIG. 4B are cross-sectional views of a portion of a resistor in a partial region of a semiconductor device according to an embodiment of the present invention.
Figure 4B:
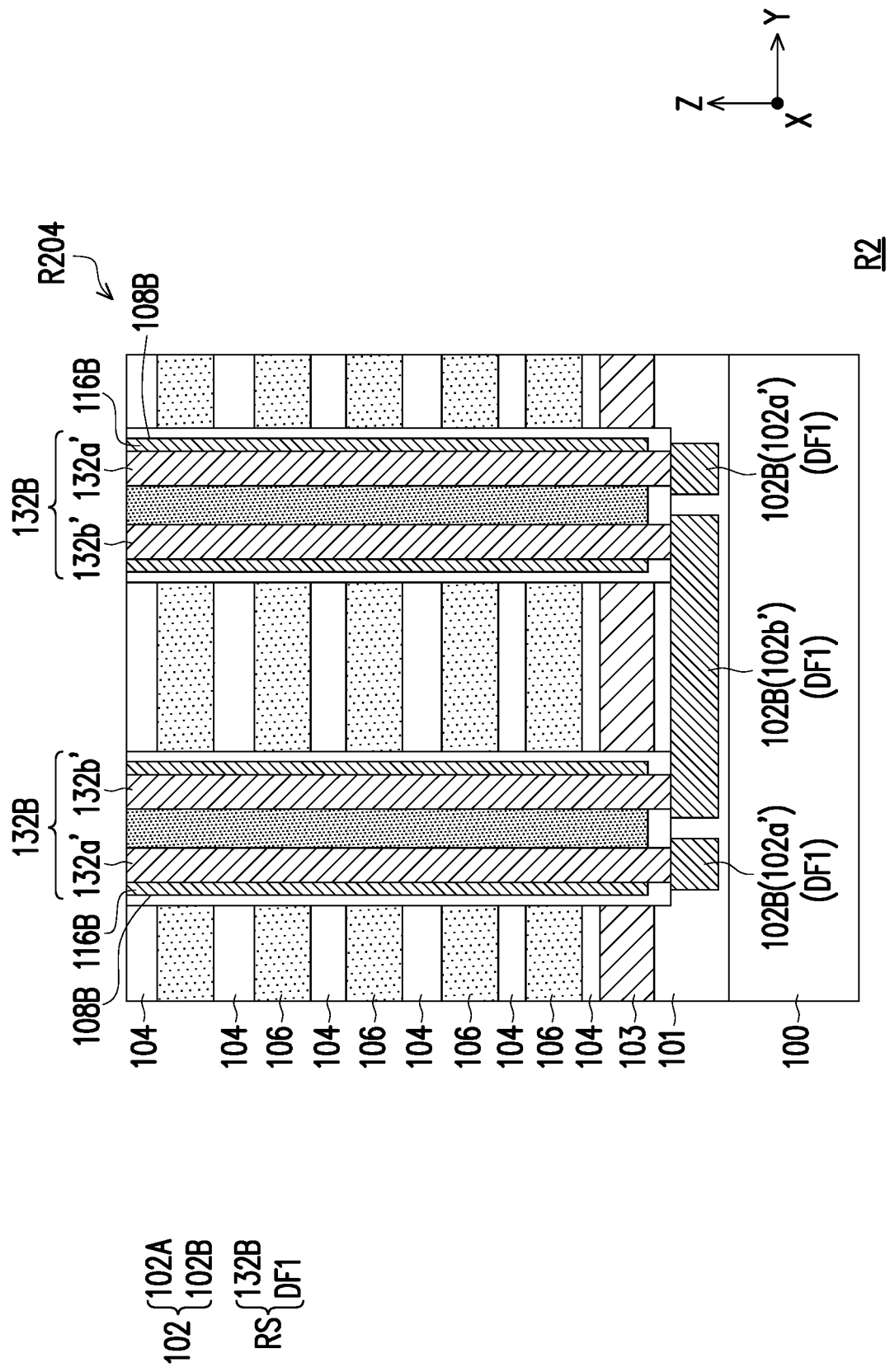

FIG. 4A and FIG. 4B are cross-sectional views of a portion of the resistor in a partial region of a semiconductor device according to an embodiment of the present invention. FIG. 4A and FIG. 4B are cross-sectional views taken along line III-III' of the partial regions 8202 and 8203 of FIG. 3B, respectively.

Referring to FIG. 3B and FIG. 4A, in the second area R2, as shown in the partial region R202 or 8203, two conductive pillars 132a' and 132b' in the same dummy channel pillar 116B are connected to single first conductive feature 102c' or 102d' in the same single dummy channel pillar 116B.

Referring to FIG. 3B and FIG. 4B, in the second area R2, as shown in the partial region R204, the conductive pillars 132a' in two dummy channel pillars 116B are respectively connected to the first conductive features 102a' in the same dummy channel pillar 116B, and the conductive pillars 132b' in two dummy channel pillars 116B are connected to the first conductive feature 102b' across the two dummy channel pillars 116B.

Figure 2E:
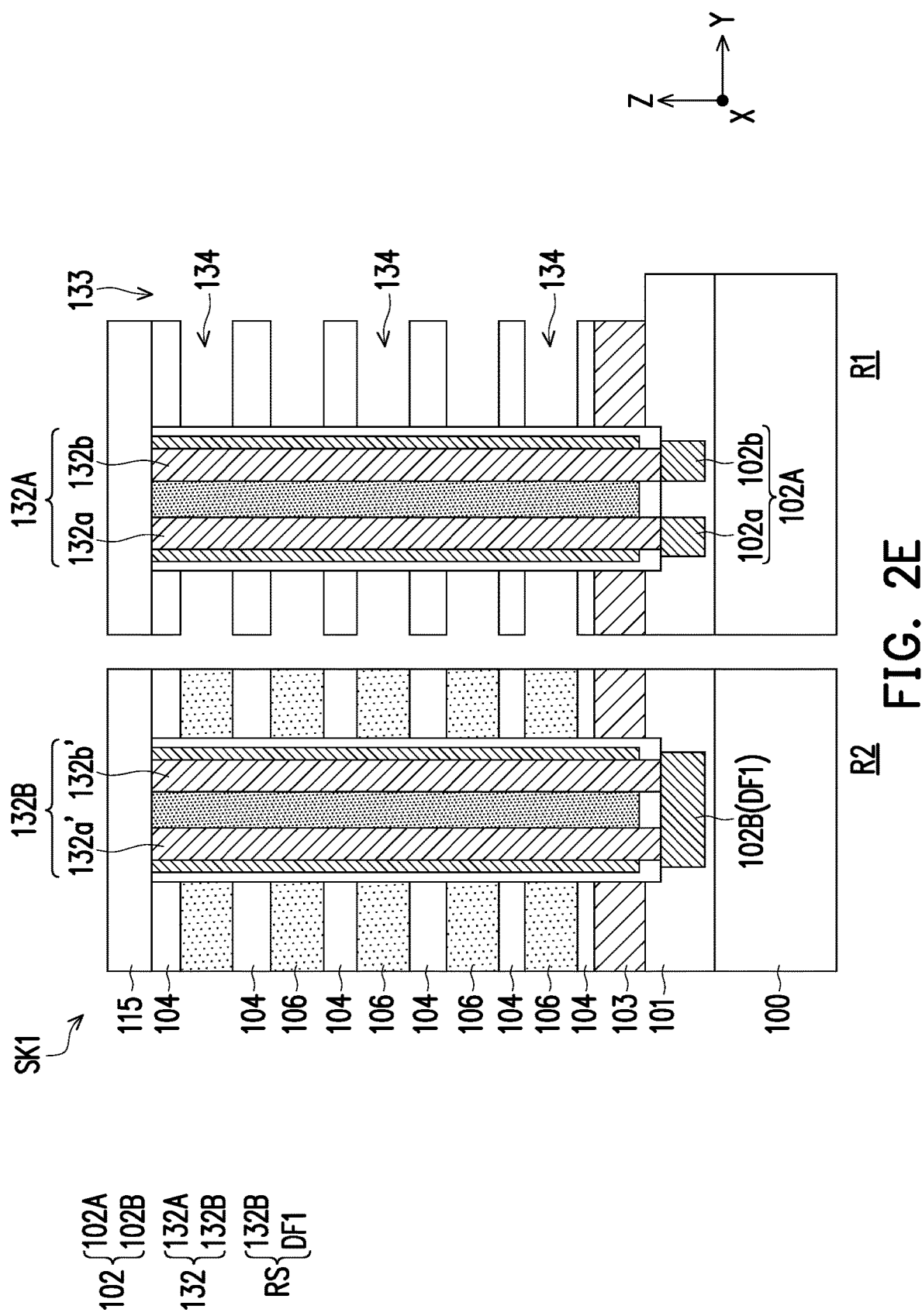

Referring to FIG. 2E, next, a capping insulating layer 115 is formed on the stack structure SK1, the channel pillar 116, the conductive pillars 132, the insulating filling layer 124, and the insulating pillar 128. The material of the capping insulating layer 115 is silicon oxide, for example.

Figure 2F:
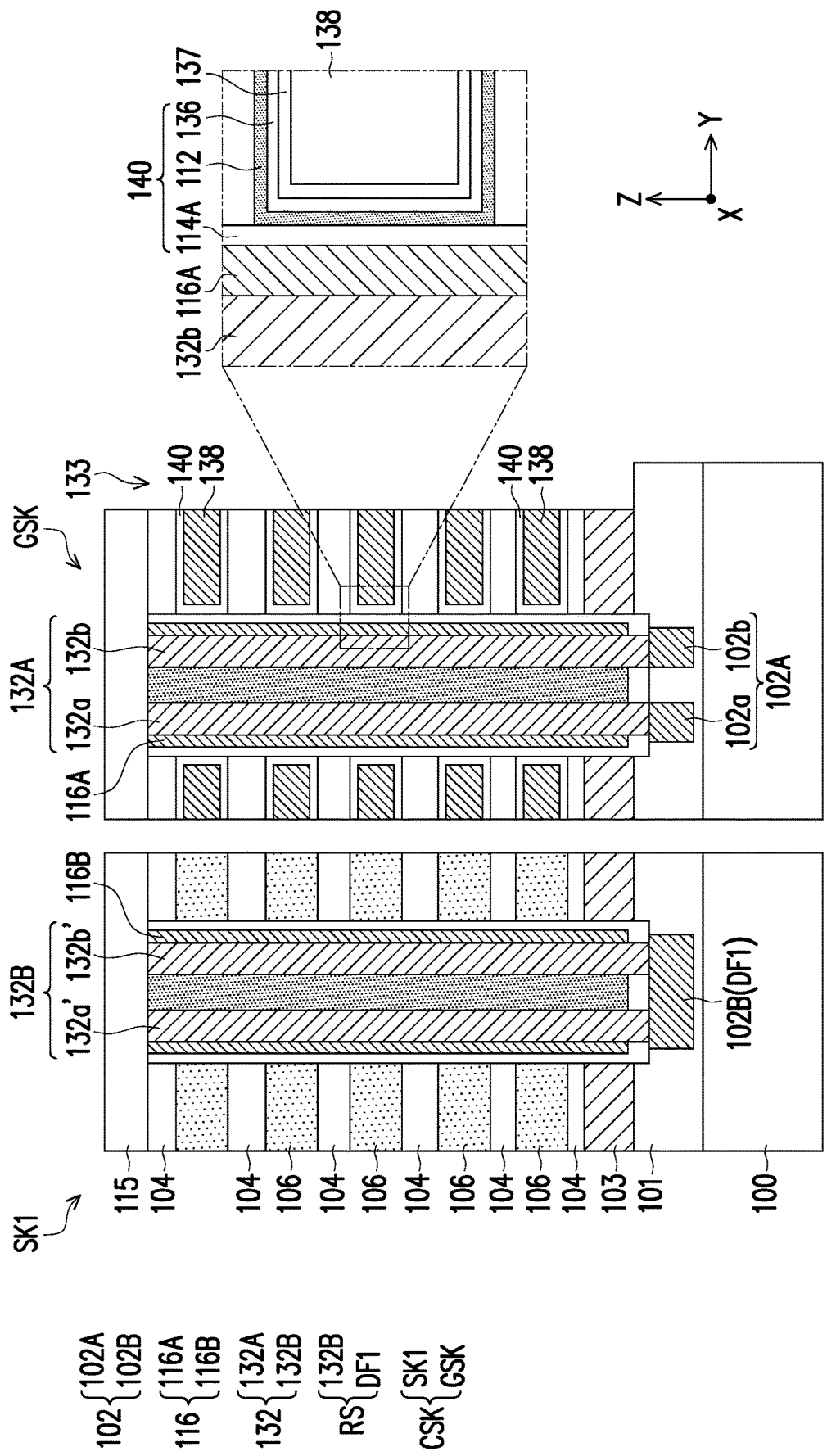

Referring to FIG. 2E and FIG. 2F, a replacement process is performed to replace the interlayers 106 in the first region R1 with a plurality of gate layers 138 and a plurality of charge storage structures 140. First, referring to FIG. 2E, a patterning process (e.g., lithography and etching processes) is performed on the capping insulating layer 115 and the stack structure SK1 to form a slit trench 133. During the etching process, the insulating layer 101 may serve as the etch stop layer, so that the insulating layer 101 is exposed by the slit trench 133. The capping insulating layer 115 and the stack structure SK1 are divided into a plurality of blocks by the slit trench 133.

Referring to FIG. 2E, an etching process (e.g., a wet etching process) is performed to partially remove the interlayers 106 in the first region R1 to form a plurality of horizontal openings 134 in the first region R1, and the interlayers 106 in the second region R2 remain. The etchant (e.g., hot phosphoric acid) used in the etching process is injected into the slit trench 133, to remove portions of the interlayers 106 exposed by the slit trench 133. By using a time mode control, most of the interlayers 106 in the first region R1 may be removed to form the horizontal openings 134.

Referring to FIG. 2F, a plurality of gate layers 138 and a plurality of charge storage structures 140 are formed in the horizontal openings 134. The charge storage structures 140 includes the tunneling layer 114, a charge storage layer 112, and a blocking layer 136. The charge storage layer 112 is silicon nitride, for example. The blocking layers 136 are, for example, silicon oxide, a material with high dielectric constant greater than or equal to 7, or a combination thereof. The material with high dielectric constant greater than or equal to 7 may be aluminum oxide ($Al_2O_3$), hafnium oxide ($HfO_2$), lanthanum oxide ($La_2O_5$), a transition metal oxide, a lanthanide oxide, or combinations thereof. The gate layers 138 include, for example, tungsten. In some embodiments, barrier layers 137 are also formed before the gate layers 138 are formed. The barrier layers 137 are, for example, titanium (Ti), titanium nitride (TiN), tantalum (Ta), tantalum nitride (TaN) or a combination thereof.

Referring to FIG. 2F, the formation method of the charge storage layers 112, the blocking layers 136, the barrier layers 137, and the gate layers 138 includes, for example, the following steps. A storage material, a blocking material, a barrier material, and a conductive material are sequentially formed in the slit trench 133 and the horizontal openings 134. An etching back process is then performed to remove the storage material, the barrier material, the barrier material and the conductor material in the slit trench to form the charge storage layers 112, the blocking layers 136, the barrier layers 137, and the gate layers 138 in the horizontal openings 134. The tunneling layer 114, the charge storage layer 112 and the blocking layer 136 are collectively referred to as a charge storage structure 140. So far, the gate stack structure GSK is formed in the first region R1. The gate stack structure GSK is disposed over the dielectric substrate 100 and includes the gate layer 138 and the insulating layer 104 which are stacked alternately with each other.

Referring to FIG. 2F, the interlayers 106 of the intermediate stack structure SK1 in the second region R2 are not removed. Instead, the interlayers 106 remain as the insulating layers 104. In other words, the intermediate stack structure SK1 is laterally adjacent to the gate stack structure GSK, and the intermediate stack structure SK1 and the gate stack structure GSK are at approximately the same height. The height of the interlayer 106 in the second region R2 is the same as the height of the corresponding gate layer (also referred to as a word line) 138 in the first region R1, and both the interlayer 106 and the gate layer (also referred to as a word line) 138 are disposed between the insulating layers 104. The gate stack structure GSK in the first region R1 and the intermediate stack structure SK1 in the second region R2 form the composite stack structure CSK.

Figure 2G:
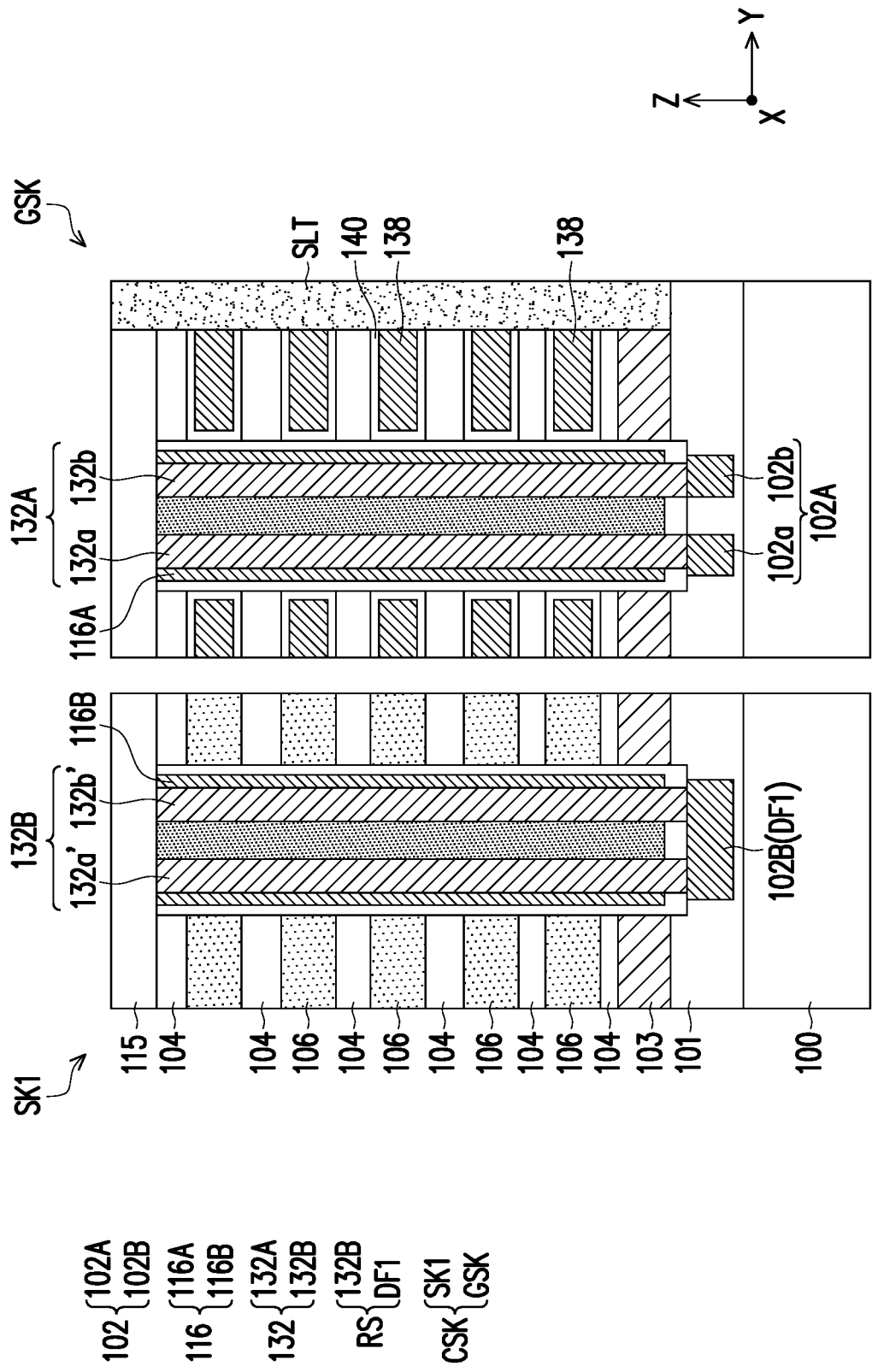

Referring to FIG. 2G, after that, a slit structure SLT is formed in the trench 133. The method of forming the slit structure SLT includes filling an insulating liner material and a conductive material on the composite stack structure CSK and in the trench 133. The insulating liner material is, for example, silicon oxide. The conductive material is, for example, polysilicon. Then, the excess insulating liner material and the excess conductive material over the composite stack structure CSK are removed through an etching back process or a planarization process to form a liner layer and a conductive layer. The liner layer and the conductive layer are collectively referred to as the slit structure. In other embodiments, the slit structure may also be filled with the insulating material without any conductive layer. In still other embodiments, the slit structure may also be the liner layer, and the liner layer has an air gap therein without any conductive layer.

After that, a plurality of contacts (not shown) are formed in the staircase region. The contact lands on the end of the gate layer 138 of the staircase structure in the first region R1, and is electrically connected to the gate layer 138 respectively.

Figure 2H:
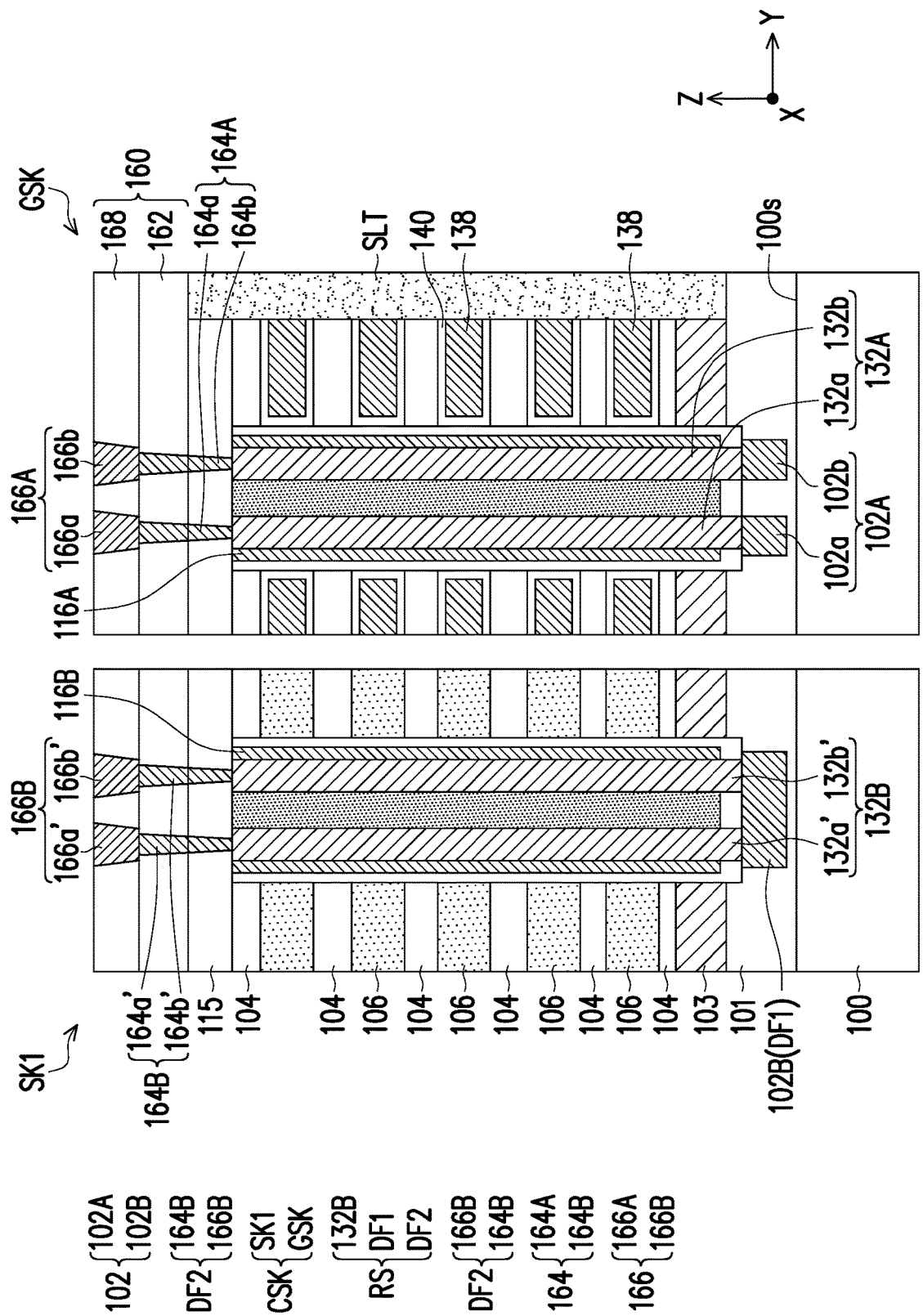

Referring to FIG. 2H, an interconnect structure 160 is formed on the composite stack structure CSK. The interconnect structure 160 includes a dielectric layer 162, a plurality of vias 164, a dielectric layer 168 and a first conductive layer 166. The interconnect structure 160 may be formed using a single damascene process, a dual damascene process or any known method.

Referring to FIG. 2H, the dielectric layer 162 is formed on the composite stack structure CSK. The vias 164 are formed in the dielectric layer 162. The dielectric layer 168 is formed on the dielectric layer 162. The first conductive layer 166 is formed in the dielectric layer 168 and is connected to the conductive pillar 132 through the vias 164.

Referring to FIG. 2H, the vias 164 include a plurality of vias 164A located in the first region R1 and a plurality of vias 164B located in the second region R2. The vias 164A includes a plurality of vias 164a and 164b. The vias 164B include a plurality of vias 164a' and 164b'. The first conductive layer 166 includes a plurality of conductive lines 166A located in the first region R1 and a plurality of conductive lines 166B located in the second region R2. The conductive lines 166A include conductive lines 166a and conductive lines 166b. The conductive lines 166B include conductive lines 166a' and conductive lines 166b'.

Referring to FIG. 2H, the conductive lines 166B (the conductive lines 166a and 166b) in the first region R1 are separated from each other. The conductive lines 166B may serve as source lines and bit lines respectively, and are electrically connected to the conductive pillars 132a and 132b through the vias 164a and 164b.

Referring to FIG. 2H, the conductive lines 166B (the conductive lines 166a and 166b) and the vias 164B (the vias 164a' and 164b') in the second region R2 may be collectively referred to as the second conductive features DF2, and serve as the third portion P3 of the resistor RS. The conductive lines 166B (the conductive lines 166a' and 166b') are respectively connected to the vias 164B (the vias 164a' and 164b'), and further connected to the underlying conductive pillars 132B (conductive pillars 132a' and 132b') and the first conductive features DF1.

Figure 5A:
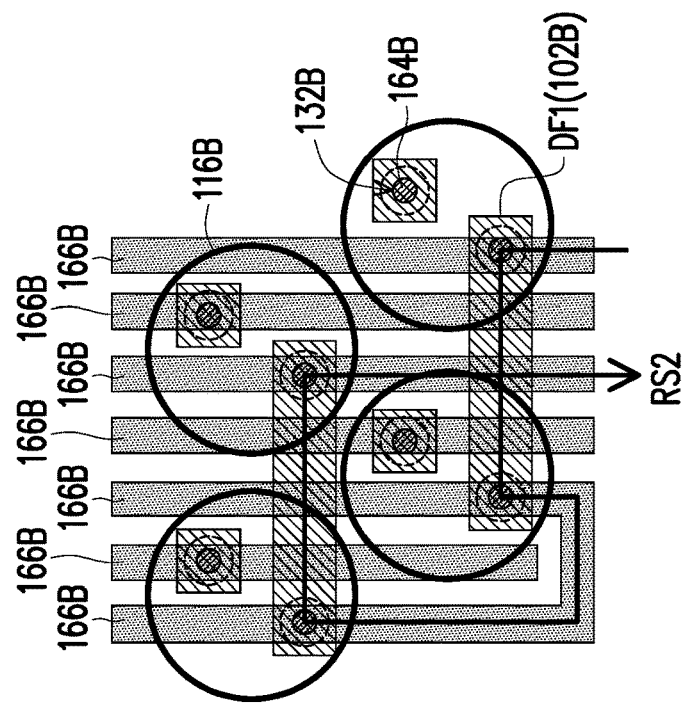
FIG. 5A to FIG. 5C are top views of resistors in various partial regions of a semiconductor device according to an embodiment of the present invention.
Figure 5B:
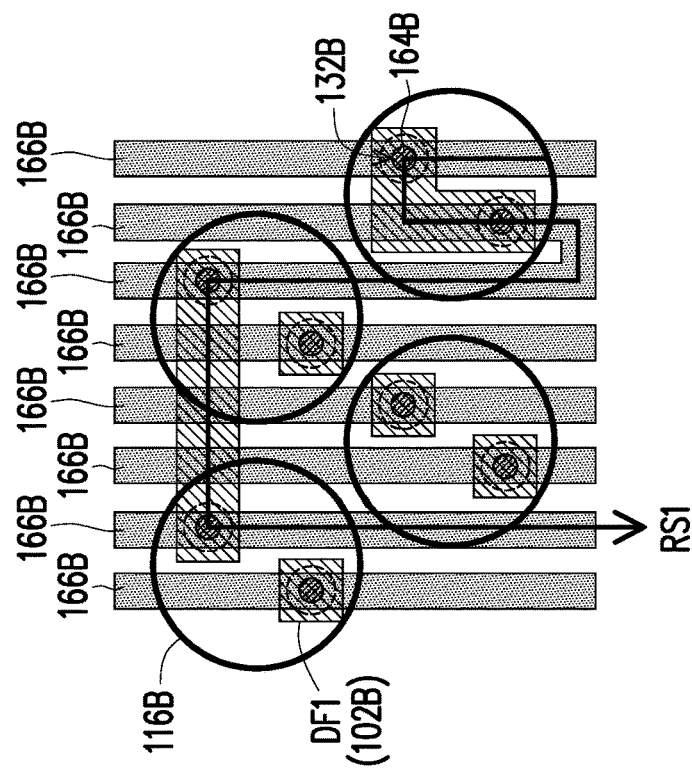
Figure 5C:
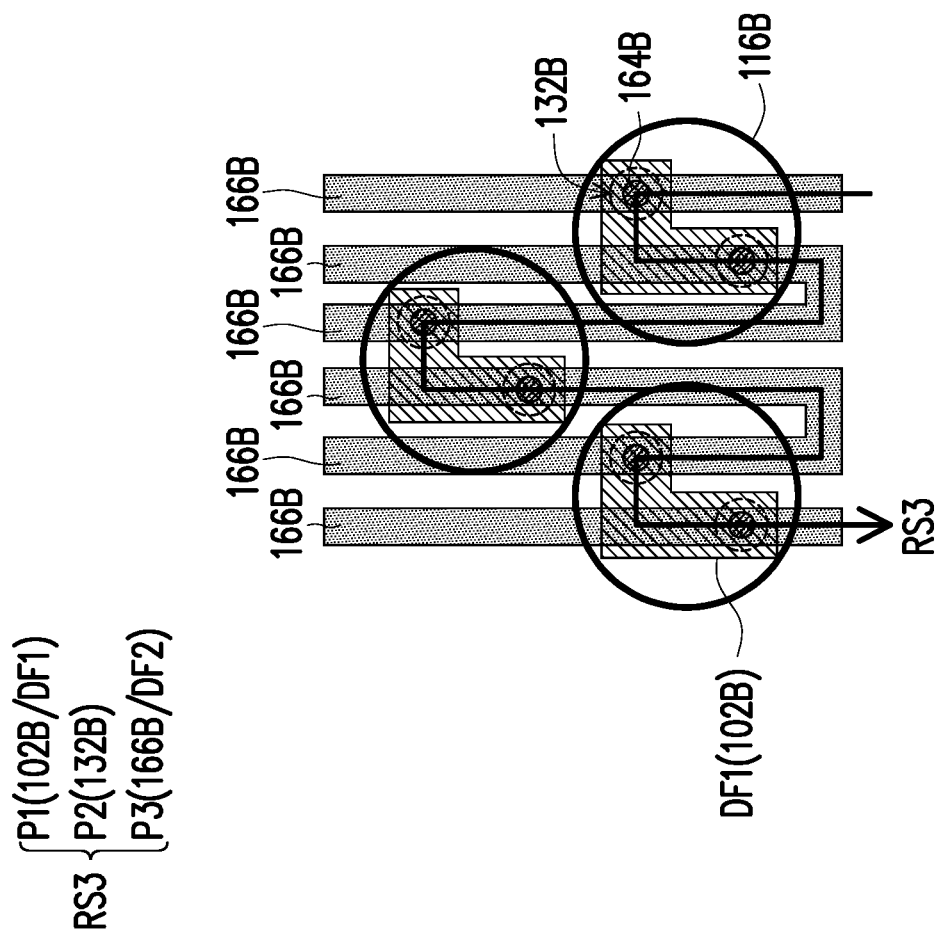

FIG. 5A to FIG. 5C are top views of resistors in various partial regions of a semiconductor device according to an embodiment of the present invention.

Referring to FIG. 2H and FIG. 5A, the resistor RS (e.g., the resistor RS1, RS2, RS3) includes three portions. The first portion P1 includes the first conductive feature DF1 located below the intermediate stack structure SK1. The second portion P2 includes the conductive pillar 132B, which is located in the intermediate stack structure SK1. The third portion P3 includes the second conductive feature DF2 located on the intermediate stack structure SK1.

Referring to FIG. 5A, in some embodiments, the conductive lines 166B (the conductive lines 166a' and 166b') in the second region R2 are separated from each other, and are electrically connected to each other through the via 164B, the conductive pillar 132B and the first conductive feature DF1, to form the resistor RS1 having a serpentine shape.

Referring to FIG. 5B and FIG. 5C, in alternative embodiments, in the second region R2, some conductive lines 166B are separated from each other, and are electrically connected to each other through the vias 164B, the conductive pillars 132B and the first conductive features DF1. In addition, some conductive lines 166B are physically connected to each other, and further electrically connected to other conductive lines 166B through the vias 164B, the conductive pillars 132B and the first conductive features DF1. The two physically connected conductive lines 166B may be disposed adjacent to (as shown in FIG. 5C) or not adjacent to each other (as shown in FIG. 5B). The conductive lines 166B are connected by themselves, and electrically connected to each other through the vias 164B, the conductive pillars 132B and the first conductive features DF1, so as to form the resistor RS2 or RS3 having a serpentine shape.

Figure 6:
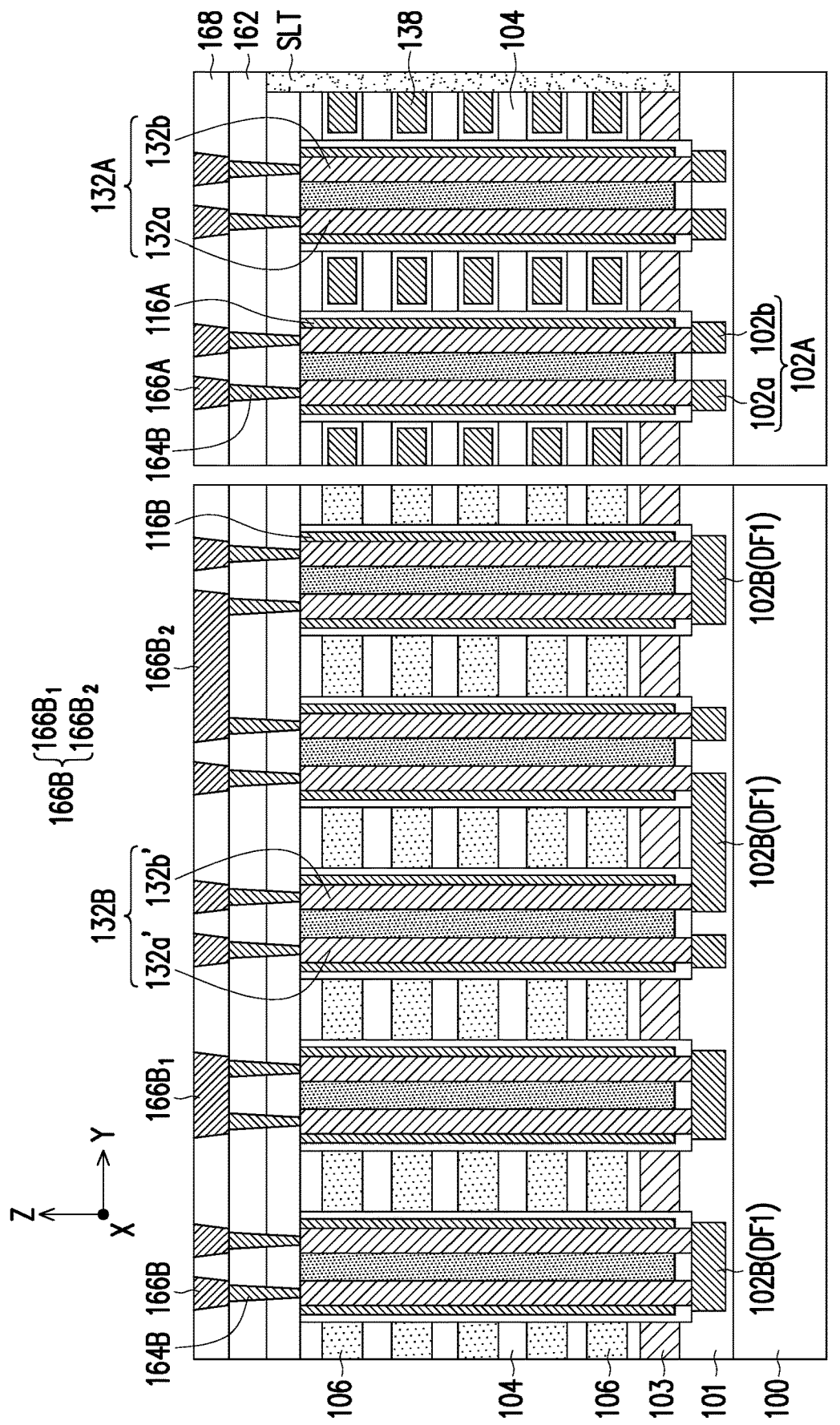
FIG. 6 is a cross-sectional view of a partial region of a semiconductor device according to an embodiment of the present invention.

FIG. 6 is a cross-sectional view of a partial region of a semiconductor device according to an embodiment of the present invention.

Referring to FIG. 6, in some embodiments, in the resistor RS4, one of the conductive lines 166B (e.g., the conductive line $166B_1$) may be connected to two vias 164B, and the two vias 164B are connected to two conductive pillars 132B in the same channel pillar 116B. In alternative embodiments, one of the conductive lines 166B (e.g., the conductive line $166B_2$) is connected to two vias 164B, and the two vias 164B are connected to two conductive pillars 132B in two dummy channel pillars 116B.

The semiconductor device of the embodiment of the present invention may form an resistor around the vertical pillar array.

The manufacturing method of the semiconductor device according to the embodiment of the present invention may be integrated with the existing process to form a resistor around the vertical pillar array.

What is claimed is:

1. A semiconductor device, comprising:
   a dielectric substrate, comprising a first region and a second region;
   a composite stack structure, located over the dielectric substrate in the first region and the second region;
   a vertical pillar array in the composite stack structure in the first region; and
   a resistor, wherein the resistor is laterally adjacent to the vertical pillar array, extends below the composite stack structure in the second region, extends through the composite stack structure, and extends above the composite stack structure.

2. The semiconductor device of claim 1, wherein the resistor comprises:
   a plurality of conductive pillars, extending through an intermediate stack structure of the composite stack structure, wherein the intermediate stack structure comprises a plurality of interlayers and a plurality of insulating layers stacked alternately with each other;
   a plurality of first conductive features, located between the dielectric substrate and the composite stack structure; and
   a plurality of second conductive features, located on the composite stack structure, wherein the plurality of conductive pillars are electrically connected to the plurality of first conductive features and the plurality of second conductive features.

3. The semiconductor device of claim 2, further comprising a plurality of dummy channel pillars extending through the intermediate stack structure, wherein the plurality of conductive pillars of the resistor pass through the plurality of dummy channel pillars.

4. The semiconductor device of claim 3, wherein one of the plurality of first conductive features is connected to two of the plurality of conductive pillars in the same one of the plurality of dummy channel pillars.

5. The semiconductor device of claim 4, wherein another of the plurality of first conductive features is connected to two of the plurality of conductive pillars in two of the plurality of dummy channel pillars.

6. The semiconductor device of claim 2, wherein the plurality of first conductive features have an island shape, an I shape or an L shape, and the resistor has a serpentine shape.

7. The semiconductor device of claim 2, wherein the plurality of second conductive features comprise:
a plurality of vias, connected to the plurality of conductive pillars; and
a plurality of dummy conductive lines, connected to the plurality of vias.

8. The semiconductor device of claim 7, wherein portions of the plurality of conductive lines are directly connected to each other, and other portions of the plurality of conductive lines are separated from each other.

9. A circuit structure, comprising:
a composite stack structure, located on a dielectric substrate, wherein the composite stack structure comprises an intermediate stack structure, and the intermediate stack structure comprises a plurality of interlayers and a plurality of insulating layers stacked alternately with each other;
a plurality of dummy channel pillars, extending through the intermediate stack structure;
a plurality of conductive pillars, extending through the plurality of dummy channel pillars and electrically connected to the plurality of dummy channel pillars;
a stop layer, located between the dielectric substrate and the composite stack structure, wherein the stop layer comprises a plurality of first conductive features; and
an interconnect structure, located above the composite stack structure, wherein the interconnect structure comprises a plurality of second conductive features,
wherein portions of the plurality of conductive pillars, portions of the plurality of first conductive features and portions of the plurality of second conductive features are connected with each other to form a resistor.

10. The circuit structure of claim 9, wherein one of the plurality of first conductive features is connected to two of the plurality of conductive pillars in the same one of the plurality of dummy channel pillars.

11. The circuit structure of claim 10, wherein another of the plurality of first conductive features is connected to two of the plurality of conductive pillars in two of the plurality of dummy channel pillars.

12. The circuit structure of claim 9, wherein the plurality of second conductive features comprise:
a plurality of vias, connected to the plurality of conductive pillars; and
a plurality of dummy conductive lines, connected to the plurality of vias.

13. The circuit structure of claim 12, wherein one of the plurality of conductive lines is connected to two of the plurality of vias, and the two of the plurality of vias are connected to two of the plurality of conductive pillars in the same one of the plurality of dummy channel pillars.

14. The circuit structure of claim 12, wherein one of the plurality of conductive lines is connected to two of the plurality of vias, and the two of the plurality of vias are connected to two of the plurality of conductive pillars in two of the plurality of dummy channel pillars.

15. The circuit structure of claim 9, wherein the intermediate stack structure is disposed in a peripheral region of the dielectric substrate, and the peripheral region is around a vertical pillar array region of the dielectric substrate.

16. The circuit structure of claim 15, further comprising:
a vertical pillar array, located in the vertical pillar array region, wherein the resistor is laterally adjacent to the vertical pillar array, wherein the vertical pillar array comprises:
a gate stack structure, comprising a plurality of gate layers and the plurality of insulating layers stacked alternately with each other, wherein the gate stack structure and the intermediate stack structure are laterally adjacent and together form the composite stack structure;
a plurality of channel pillars, extending through the gate stack structure;
a plurality of source pillars and a plurality of drain pillars, extending through the plurality of channel pillars, wherein the plurality of source pillars and the plurality of drain pillars are respectively electrically connected to the plurality of channel pillars;
a plurality of charge storage structures, located between the plurality of gate layers and the plurality of channel pillars;
the stop layer, further comprising a plurality of conductive patterns, wherein the plurality of source pillars and the plurality of drain pillars land on the plurality of conductive patterns; and
the interconnect structure, further comprises a plurality of source lines and a plurality of bit lines, wherein the plurality of source lines and the plurality of bit lines are respectively electrically connected to the plurality of source pillars and the plurality of drain pillars.

17. A method of manufacturing a semiconductor device, comprising:
providing a dielectric substrate, wherein the dielectric substrate comprises a first region and a second region;
forming a composite stack structure over the first region and the second region of the dielectric substrate; and
forming a vertical pillar array and a resistor, wherein
the vertical pillar array is disposed in the composite stack structure in the first region,
and the resistor is laterally adjacent to the vertical pillar array, extends below the composite stack structure in the second region, passes through the composite stack structure, and extends above the composite stack structure.

18. The method of claim 17, wherein forming the vertical pillar array and the resistor comprises:
forming a stop layer on the dielectric substrate, wherein the stop layer comprises a plurality of conductive patterns located in the first region and a plurality of first conductive features located in the second region;
forming an intermediate stack structure on the stop layer, wherein the intermediate stack structure comprises a plurality of interlayers and a plurality of insulating layers stacked alternately with each other;
forming a plurality of first openings and a plurality of second openings in the intermediate stack structure, wherein the plurality of first openings are located in the first region, and the plurality of second openings are located in the second region;
forming a plurality of channel pillars and a plurality of dummy channel pillars, wherein the plurality of channel pillars are located on sidewalls of the plurality of the first openings, and the plurality of dummy channel pillars are located on sidewalls of the plurality of second openings;
forming a plurality of source pillars, a plurality of drain pillars and a plurality of conductive pillars, wherein the plurality of source pillars and the plurality of drain pillars extend through the plurality of channel pillars and land on the plurality of conductive patterns, and the plurality of conductive pillars extend through the plurality of dummy channel pillars and land on the plurality of first conductive features;

removing the plurality of interlayers in the first region to form a plurality of horizontal openings;

filling a plurality of gate layers in the plurality of horizontal openings, wherein the plurality of gate layers and the plurality of insulating layers in the first region alternately stack with each other to form a gate stack structure, and the gate stack structure in the first region and the intermediate stack structure in the second region form the composite stack structure;

forming a plurality of charge storage structures between the plurality of gate layers and the plurality of channel pillars; and forming an interconnect structure on the composite stack structure, wherein the interconnect structure comprises:

a plurality of source lines and a plurality of bit lines, located on the gate stack structure and are respectively electrically connected to the plurality of source pillars and the plurality of drain pillars; and a plurality of second conductive features, located on the intermediate stack structure and electrically connected to the plurality of conductive pillars, wherein the plurality of gate layers, the plurality of charge storage structures, the plurality of source pillars and the plurality of drain pillars form the vertical pillar array, and the plurality of first conductive features, the plurality of conductive pillars, and the plurality of second conductive features are connected to each other to form the resistor, and the resistor passes through the intermediate stack structure.

19. The manufacturing method of a semiconductor of claim 18, wherein one of the plurality of first conductive features is connected to two of the plurality of conductive pillars in the same one of the plurality of dummy channel pillars.

20. The method for manufacturing a semiconductor device of claim 19, wherein another of the plurality of first conductive features is connected to two of the plurality of conductive pillars in two of the plurality of dummy channel pillars.

* * * * *